(12) United States Patent
Watanabe

(10) Patent No.: US 6,696,889 B2
(45) Date of Patent: Feb. 24, 2004

(54) ACQUISITION OF MR SIGNALS USING MULTIPLE-QUANTUM-COHERENCE TRANSFER

(75) Inventor: Hidehiro Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/943,090

(22) Filed: Aug. 31, 2001

(65) Prior Publication Data

US 2002/0101238 A1 Aug. 1, 2002

(30) Foreign Application Priority Data

Aug. 31, 2000 (JP) .................................... 2000/264185

(51) Int. Cl.⁷ .................................................. G01V 3/00
(52) U.S. Cl. ....................................................... 329/309
(58) Field of Search ................................... 324/307, 309

(56) References Cited

U.S. PATENT DOCUMENTS

| | | | | |
|---|---|---|---|---|
| 4,918,387 A | * | 4/1990 | McKinnon et al. | 324/309 |
| 4,972,147 A | * | 11/1990 | Van Vaals | 324/307 |
| 5,019,784 A | * | 5/1991 | Garwood et al. | 324/307 |
| 5,111,819 A | * | 5/1992 | Hurd | 600/410 |
| 5,121,059 A | * | 6/1992 | Wieland | 324/309 |
| 5,122,748 A | * | 6/1992 | Oh et al. | 324/309 |
| 5,677,628 A | * | 10/1997 | Watanabe et al. | 324/309 |
| 5,818,230 A | * | 10/1998 | Katz et al. | 324/309 |
| 6,005,390 A | * | 12/1999 | Watanabe et al. | 324/307 |
| 6,133,736 A | * | 10/2000 | Pervushin et al. | 324/307 |
| 6,144,199 A | * | 11/2000 | Sharf et al. | 324/306 |
| 6,304,084 B1 | * | 10/2001 | Star-Lack et al. | 324/307 |
| 6,369,569 B1 | * | 4/2002 | Heid | 324/309 |
| 6,373,250 B1 | * | 4/2002 | Tsoref et al. | 324/309 |
| 6,528,997 B2 | * | 3/2003 | Zhong et al. | 324/307 |
| 6,605,942 B1 | * | 8/2003 | Warren | 324/307 |

OTHER PUBLICATIONS

Rothman et al, "Localized ¹H NMR Measurements of γ–aminobutyric acid in human brain in vivo," Proc. Natl. Acad. Sci. USA, vol. 90, pp. 5662–5666, Jun. 1993, Neurology.

(List continued on next page.)

Primary Examiner—Diego Gutierrez
Assistant Examiner—Dixomara Vargas
(74) Attorney, Agent, or Firm—Nixon & Vanderhye P.C.

(57) ABSTRACT

A magnetic resonance signal is acquired from a $J_{HH}$-coupled ¹H within an object. After application of a wideband first radio-frequency magnetic pulse, a first frequency-selective radiation pulse is applied to a specific nucleus ¹H coupled to a desired nucleus ¹H through a homonuclear spin-spin coupling ($J_{HH}$-coupling), thus multiple-quantum coherences between the nuclei ¹H being generated. A second radio-frequency magnetic pulse is then applied. A second frequency-selective radiation pulse is then applied to the specific nucleus ¹H to generate a single-quantum coherence of the desired nucleus ¹H. Thus, a magnetic resonance signal can be acquired from the desired nucleus ¹H. The acquisition of the signal is robust, adjustment in the phases of the radio-frequency magnetic pulses is not required, and an acquired spectrum is avoided from being visually complicated.

22 Claims, 20 Drawing Sheets

OTHER PUBLICATIONS

Qiuhong He et al, "Single–Scan in Vivo Lactate Editing with Complete Lipid and Water Suppression by Selective Multiple–Quantum–Coherence Transfer (Sel–MQC) with Application to Tumors" Journal of Magnetic Resonance, Series B 106, 203–211 (1995).

Weber et al, "Localized J–Edited MR Proton Spectroscopy for Detection of GABA in the Human Brain", Institute of Biomedical Engineering and Medical Informatics, University of Zurich and Swiss Federal Institute of Technology Zurich, Switzerland, Proc. Int. Soc. Magn. Reson. Med. P. 522, 1995.

Japanese Patent Laid–Open (Kokai) Publication No. 9–262221, filed on Mar. 29, 1996 and published on Oct. 7, 1997, Watanabe, English abstract of this publication is attached.

Mescher et al, "Simultaneous in vivo Spectral Editing and Water Suppression", NMR in Biomedicine, vol. 11, 266–272 (1998).

Keltner et al, "In Vivo Detection of GABA in Human Brain Using a Localized Double–Quantum Filter Technique", MRM 37: 366–371 (1997).

Shen et al, "In Vivo Chemical Shift Imaging of γ–Aminobutyric Acid in the Human Brain", Magnetic Resonance in Medicine 41: 35–42 (1999).

* cited by examiner

N-ACETYL-ASPARTATE (NAA)

γ-AMINOBUTYRIC ACID (GABA)

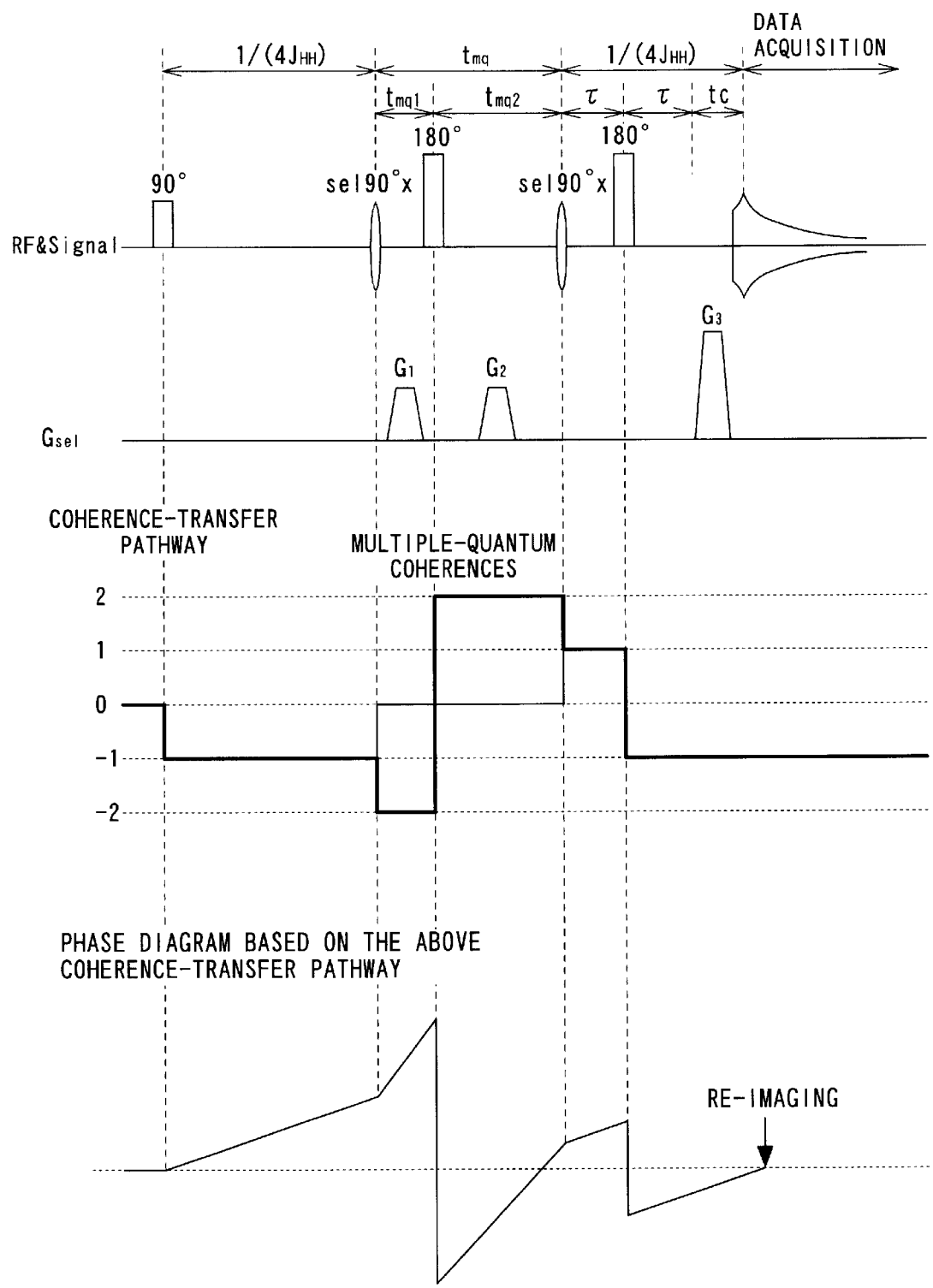
F I G. 17

ACQUISITION OF MR SIGNALS USING MULTIPLE-QUANTUM-COHERENCE TRANSFER

BACKGROUND OF THE INVENTION

1. Technical Field of the Invention

The present invention relates to a magnetic resonance apparatus for acquiring pieces of chemical and physical information in relation to various types of substances by making use of a magnetic resonance phenomenon, and in particular, to magnetic resonance spectroscopy or magnetic resonance spectroscopic imaging based on a technique known as multiple-quantum-coherence transfer.

2. Related Art

A magnetic resonance apparatus has been widely used in applications such as chemical analysis and medical diagnosis in order to acquire chemical and physical information about various substances. Some representative techniques include magnetic resonance imaging (MRI; hereafter referred to as "MRI"), magnetic resonance spectroscopy (MRS; hereafter referred to as "MRS"), and magnetic resonance spectroscopic imaging (MRSI; hereafter referred to as "MRSI").

The MRI has been mainly used in the medical field, in which a distribution of water can be imaged based on information about relaxation time or others of magnetic spins present in an organism. Thus, contour information and/or functional information of an object to be examined can be obtained in a non-invasive manner. For this reason, MRI systems have become indispensable modalities for the clinical purpose.

On the other hand, an MRS system is able to provide magnetic resonance spectroscopy of a substance, while an MRSI system has the capability of providing a spectroscopic distribution. Both systems detect a magnetic resonance signal of $^1H$, $^{13}C$, $^{31}P$ or others of a metabolite, so that they provide non-invasively information about metabolism in an object to be examined.

For magnetic resonance spectroscopy and magnetic resonance spectroscopic imaging, a difference between magnetic environments of $^1H$ or others (, which results from a difference between molecular structures of metabolites), that is, a difference between chimerical shifts causes a slight difference between their resonance frequencies. Such frequency differences produce separated peaks of resonance frequency curves of metabolites shown along the frequency axis. For example, "$^1H$ MRS" for the brain provides the peaks of various metabolites including N-acetyl-aspartate (NAA), creatine (Cr), choline (Cho), γ-aminobutyric acid (GABA). Because these metabolites are substances produced due to chemical changes, that is, changes in the metabolism in the brain, it is expected that detecting the peaks enables diagnosis of metabolic errors.

As representatives for practical data acquisition sequences for the foregoing MRS and MRSI, there have been known various techniques including a PRESS (point resolved spectroscopy) technique and a STEAM (stimulated echo acquisition mode) technique.

FIG. 1 shows a PRESS sequence used as the data acquisition sequence for MRS, while FIG. 2 a STEAM sequence used as the data acquisition sequence for MRSI. In both the sequences, the spatial three axes are depicted by references i, j and k, in which the three axes can arbitrarily be assigned to the physical x-, y- and z-axes.

In these sequences, a pulse for suppressing a water signal, which is for example a CHESS pulse, is first applied, thus the water signal being saturated in a pseudo manner. Localized excitation pulses consisting of appropriately combined radio-frequency magnetic pulses (RF pulses) and gradient pulses are then sequentially applied in the three-axis directions. In response to those applications, echo signals arising from a three-dimensional localized region are acquired. (Of the localized excitation pulses, the radio-frequency magnetic pulses are called slice selection pulses and the gradient pulses are called as slice gradient pulses, respectively, when necessary.) The PRESS sequence enables acquisition of spin echo signals, whereas the STEAM sequence enables acquisition of stimulated echo signals. Reconstructing the acquired signals provides a frequency spectrum at the localized region.

The PRESS and STEAM techniques are preferable for detecting peaks of NAA, Cr, Cho and others in spectroscopy. For instance, as shown in FIG. 3A, there are several hydrogen nuclei $^1H$ in the NAA molecule. $^1H$-MRS is normally directed to the detection of $^1H$ present in $CH_3$, which is a target to be detected. Carbon nuclei present in the NAA are numbered as illustrated in FIG. 3A, so the above $CH_3$ belongs to NAA C6. A hydrogen nucleus $^1H$ coupled with the carbon nuclei C6 is referred to as an NAA-6. The NAA-6 has a peak at a $^1H$ chemical shift of 2.02 ppm, and the peak is observable by the PRESS sequence or STEAM sequence.

In contrast, the other hydrogen nuclei $^1H$ of NAA, i.e., NAA-2 and NAA-3 are unobservable, because the NAA-2 and NAA-3 are subjected to a homonuclear spin-spin coupling (called $J_{HH}$ coupling) between their nuclei $^1H$. The magnitude of this spin-spin coupling is expressed by a spin-spin coupling constant $J_{HH}$ (normally expressed with the unit "Hz"). The NAA-2 is individually coupled with two hydrogen nuclei $^1H$ of the NAA-3. As a result, the NAA-2 shows four split peaks, thus reducing the intensity of a signal. However, in the case of the NAA-6, it is magnetically equivalent to three hydrogen nuclei $^1H$ and there is no nucleus $^1H$ around the NAA-6, thus having no $J_{HH}$ coupling. Hence the peak of a higher intensity is provided, thus being observable. As described, when the NAA in an organism is observed, it is enough to detect the NAA-6. The fact that the NAA-2 and NAA-3 are difficult to observe has not become a problem, so that the foregoing PRESS sequence and others can be used to observe the NAA.

On the other hand, in the γ-aminobutyric acid (GABA) that plays a significant role as a nerve transmission substance in the suppression system in the human brain, all the hydrogen nuclei 1H are connected to each other through the homonuclear spin-spin coupling. The GABA is one of the metabolites that are difficult to observe under the PRESS or STEAM sequence. The GABA has hydrogen nuclei $^1H$ belonging to GABA-2, -3 and -4, as shown by the molecular formula in FIG. 3B, all of which are $J_{HH}$-coupled to each other. An abundance of the GABA is no less than about 1 mM, which is equivalent to about a tenth of that of NAA or Cr. This is one reason that makes it difficult to observe the GABA. To overcome this difficulty, several methods of editing a GABA peak, that is, GABA observation that makes use of the homonuclear spin-spin coupling, have been proposed.

One method is a difference spectrum method based on an inverted GABA-3. (Refer to "D. L. Rothmanetal., Proc. Natl. Acad. Sci. USA, vol.90, pp.5662–5666, 1993.") In the GABA, a chemical shift of GABA-2 is 2.30 ppm, that of GABA-3 is 1.91 ppm, and that of GABA-4 is 3.01 ppm, and $J_{HH}$ is 7.3 Hz. Hence, in the case of the static field is 1.5 T in strength, which can be obtained by ordinary used clinical MR systems, a frequency difference $\Delta\omega$ between the GABA-2 and GABA-3 is $\Delta\omega=24.9$ Hz and $\Delta\omega/J_{HH}=3.4$. Between the GABA-3 and GABA-4, $\Delta\omega=70.2$ Hz and $\Delta\omega/J_{HH}=9.6$. Accordingly, the GABA-2 is strongly coupled to the GABA-3, while the GABA-3 is coupled to the GABA-4 with an intervening force slightly weaker than that between the GABA-2 and GABA-3. Thus, the difference spectrum method makes use of the coupling between the GABA-3 and GABA-4 in order to observe the GABA-4.

Pulse sequences used for this difference spectrum method are exemplified in FIGS. 4A and 4B. A pulse sequence of 90°–180° pulses shown in FIG. 4A enables a spin echo signal to be acquired. An echo time TE in this acquisition is set to $\frac{1}{2}J_{HH}$, i.e., 68 ms. In addition, jump and return pulses are used as the 180° pulse. The jump and return pulses are composed of two 90° pulses so as to form complex pulses radiated to GABAs other than the GABA-3 by setting a center frequency between the 90° pulses to the GABA-3, that is, 1.91 ppm. Additionally, the jump and return pulses can be composed so as to function as almost a 180° pulse toward the GABA-4, that is, 3.01 ppm within an object to be observed.

As shown in FIG. 4B, a pulse sequence formed by adding "delays alternating with nutations for tailored excitation (DANTE) pulses" to the foregoing pulse sequence can be used for acquiring spin echo signals. The DANTE pulses are narrower in bandwidth and their carrier frequencies are determined so that the DANTE pulses are radiated to 1.91 ppm, that is, the GABA-3.

The two hydrogen nuclei $^1H$ of the GABA-4 are not equivalent to each other in terms of their magnetism, and $J_{HH}$-coupled to the two hydrogen nuclei $^1H$ of the GABA-3. As a result, the GABA-4 represents four split peaks, but the central two peaks are overlapped one on another in vivo. The three split peaks are thus observed, in which a frequency difference between the outside two peaks corresponds to double the $J_{HH}$.

When executing the pulse sequence shown in FIG. 4A toward the GABA, a spectrum pattern shown in FIG. 5A is obtained. Further, when executing the pulse sequence shown in FIG. 4B, a spectrum pattern shown in FIG. 5B is obtained, because the GABA-3 is inverted. Thus, a difference is calculated between the spectra shown in both FIGS. 4A and 4B, resulting in that only the outside two peaks of the spectrum of the GABA-4 are obtained (refer to FIG. 5C). It is therefore possible that a signal of Cr (3 ppm) that has a $^1H$ chemical shift approximately equal to the GABA-4 (has a hydrogen nucleus $^1H$ of which chemical shift is 3.01 ppm) can be removed.

Another pulse sequence is shown in FIG. 6, which has been devised on the basis of the difference spectrum method that is able to edit a signal of the GABA-4 detected from a spatial three-dimensional localized region (refer to "O. M. Weber et al., Proceeding of International Society of Magnetic Resonance in Medicine, p.522, 1995").

However, in the case that the above techniques are used, it is significant that the system is stable in both performing a sequence with no DANTE pulse and performing another sequence with DANTE pulses. Because the spectrum peak of Cr is about twenty times as large as that of the GABA in intensity, unstable factors of the system, such as slight fluctuations in the intensify of an RF magnetic pulse, make it difficult to edit the signal of GABA-4.

On the other hand, differently from the above method, another editing technique of the GABA-4, which uses multiple-quantum coherences, has been proposed. Since there are $J_{HH}$-couplings in the GABA-3 and -4, it is possible to create the multiple-quantum coherences. A pulse sequence for such method is depicted in FIG. 7. In this pulse sequence, the first three RF pulses consisting of a 90° pulse, a 180° pulse, and a 90° pulse are applied to create multiple-quantum coherences of the GABA-3 and -4. FIG. 7 also shows coherence-transfer pathways to be selected during the performance of this pulse sequence. As shown by the pulse sequence in FIG. 7, it is required that time periods between the pulses be set to $1/(8J_{HH})$ and the phases of the first and third 90° pulses be set to x. The multiple-quantum coherences generated by the above three pulses are then subject to a further 90° pulse to be applied in succession, so that the coherences are formed into the single quantum-coherence, which is observable. The duration of the multiple-quantum coherences, that is, a period between the third and fourth 90° pulses is expressed by $t_{mq}$ that means multiple-quantum coherences.

During the period $t_{mq}$ in the pulse sequence, the $^1H$ chemical shift is evolved. For re-imaging the hydrogen nuclei $^1H$ of the evolved chemical shift, another 180° pulse may be applied at the center of the period of $t_{mq}$. A pulse sequence including such 180° pulse is shown in FIG. 8 (refer to "J. R. Keltner et. Al., Magn. Reson. Med., vol. 37, pp.366–371, 1997"). The pulse sequence in FIG. 8 additionally uses the forgoing 90 °–90° pulses, that is, jump and return pulses not to excite a water signal. When using the methods with the multiple-quantum coherences, the water signal can be suppressed by a coherence selective gradient pulse as well as a chemical shift selective (CHESS) pulse. The foregoing pulse sequences permit multiple-quantum coherences, that is, zero-quantum and double-quantum coherences to be generated during the $t_{mq}$ period. The orders of the coherences are 0 (zero), +2, and –2. A gradient pulse applied during the $t_{mq}$ period will not dephase the zero-quantum coherence, but will dephase the double-quantum coherences to phases of "$\pm 2\gamma_{1H}\int^{tg}_0 G_1 dt$," wherein $\gamma_H$ is a gyromagnetic ratio, G is the intensity of the gradient pulse, and $t_g$ is an application time of the gradient pulse.

After the multiple-quantum coherences, there is provided a period for a single-quantum coherence. The coherence with the order of "–1," which can be detected by quadrature phase detection, has a phase of "$-\gamma_{1H}\int^{tg}_0 G_2 dt$." Accordingly, when a radio of G1:G2 is for example set to 1:2, coherence-transfer pathways of "2 to –1" can be chosen, thus a signal from water (water signal) and a signal from Cr (Cr signal) being suppressed. Differently from this way of suppressing the water signal, the suppression method that makes use of the CHESS pulse has a performance depending on a frequency distribution, that is, magnetic non-uniformity or fluctuations in frequency. However, the method based on the foregoing coherence selective gradient pulses uses the coherence-transfer pathways of "2 to –1." As a result, although the sensitivity reduces down to the half obtained by the CHESS pulse method, the method that uses the coherence selective gradient pulses has still an advantage that it does not depend on the magnetic non-uniformity, thus being robust. This feature is significant for signal detection from an organism.

The GABA editing method based on the multiple-quantum coherences has the advantage descried above. However, in the case of this method, to create the multiple-quantum coherences requires that phases of the first and second 90° pulses be adjusted in a critical manner. A poor adjustment of those phases may affect sensitivity in the acquisition of signals. During the performance of the pulse sequence, gradient pulses are applied to define a region to be localized. Coupling between the gradient pulses and the coil of a static magnet causes a phenomenon, called $B_0$ shifts, when the gradient pulses are applied, thus leading deviations in the phase. This reduces the sensitivity, and requires that RF signals be adjusted in the phases when the gradient pulses are applied.

Further, since the foregoing method based on the multiple-quantum coherences additionally selects the nuclei $^1H$ of $J_{HH}$-coupled metabolites other than GABA, there are provided peaks other than a desired peak in the spectrum, thus giving complication to the spectrum. For example, FIG. 6 shown in the paper "J. R. Keltneretal., Magn. Reson. Med., vol. 37, pp. 366–371 (1997)," which proposes a GABA editing method on the basis the multiple-quantum coherences, provides a spectrum that bristles with the peaks of NAA, glutamic acid, and glutamine (both of the glutamate and the glutamine are impossible to separate in the spectrum, so shown by a reference "GLx"). This involves a post processing operation to extract only the peak of the GABA, making the operations cumbersome.

Another pulse sequence is shown in FIG. 9, in which non-selective excitation pulses are used for generating multiple-quantum transfers, then succeeding RF pulses applied after the $t_{mq}$ period are in charge of localized excitation (refer to "J. Shen et al., Magn. Reson. Med., vol. 41, pp.35–42, 1999"). In this pulse sequence, three non-selective excitation pulses generate the multiple-quantum coherences, and then a frequency-selective radiation 180° pulse (sel 180°) directed to the GABA-4 is applied to invert only the GABA-4. A frequency-selective radiation 90° pulse (sel 90°) is then applied to the GABA-3 in order to generate the single-quantum coherence. Two slice-selective RF pulses are then used to edit only the GABA-4. When this sequence is used to carry out a spatial three-dimensional localized excitation, it is required, as explained above, that the three RF pulses be applied to obtain functions of slice-selective RF pulses after the $t_{mq}$ period. That is, at least eight RF pulses should be applied. However, the application of a large number of RF pulses will lead to a problem that a signal loss is caused more easily due to errors in flip angles or RF distributions.

Still another editing method that uses the multiple-quantum coherences has been proposed by "Q. HE et al., J. Magn. Reson. B. vol. 106, pp.203–211 (1995)." A pulse sequence according to this proposal is directed to detecting spectroscopy of lactate, which is outlined in FIG. 10. As shown therein, the pulse sequence employs a frequency selective radiation pulse applied first to $CH_3$ (lipid) of a molecule of the lactate. A second frequency selective radiation pulse is then applied to the $^1H$ of CH $J_{HH}$-coupled with the $CH_3$. This application is then followed by a 180° RF pulse applied in a non-selective manner, then a third frequency selective radiation pulse is again applied to the $^1H$ of the CH to acquire an echo signal.

However, in the pulse sequence shown in FIG. 10, the first-applied excitation pulse is composed of a frequency selective radiation pulse directed to the $CH_3$. Therefore, the frequency of the frequency selective radiation pulse should be strictly equal to the resonance frequency of the $CH_3$, which involves cumbersome operations to adjust the frequency. Further, because it is required that the bandwidth of the first excitation pulse be narrow, its RF pulse length (the length of a pulse in the time axis direction) becomes necessarily longer than that of a wideband pulse. Hence, the strength of a slice gradient pulse applied concurrently with the first excitation pulse should be lowered compared to that for a wideband pulse. The pulse sequence shown in FIG. 10 requires that the static field be higher in its non-uniformity.

SUMMARY OF THE INVENTION

An object of the present invention is therefore to provide a technique of acquiring an echo from $J_{HH}$-coupled $^1H$ based on a magnetic resonance phenomenon, the technique being robust to unstable factors of a system, eliminating the necessity of adjusting phases of radio-frequency magnetic pulses to be applied, being able to obtain a spectrum shown in a simplified form, and having higher resistance to signal loss due to errors in flip angles and/or radio-frequency magnetic distributions.

In order to realize the above object, the present invention provides, as one category, a method of acquiring a magnetic resonance signal. The acquisition method is able to acquire the magnetic resonance signal from a nucleus $^1H$ involving a homonuclear spin-spin coupling exerted between nuclei $^1H$ by applying to an object placed in a static magnetic field, radio-frequency magnetic pulses and gradient magnetic pulses in predetermined procedures on the basis of a resonance frequency of hydrogen nuclei $^1H$. This acquisition method is provided in three fundamental modes.

A first mode is provided by the acquisition method comprising the steps of applying to the object a first radio-frequency magnetic pulse to excite the nuclei $^1H$ of a plurality of compounds; applying, after applying the first radio-frequency magnetic pulse, to the object a first frequency-selective radiation pulse to excite a specific nucleus $^1H$ coupled to a desired nucleus $^1H$ among the nuclei $^1H$ of the plurality of compounds through the homonuclear spin-spin coupling; applying, after applying the first frequency-selective radiation pulse, to the object a second radio-frequency magnetic pulse; applying, after applying the second radio-frequency magnetic pulse, to the object a second frequency-selective radiation pulse to excite the specific nucleus $^1H$; and acquiring, after applying the second frequency-selective radiation pulse, the magnetic resonance signal of the desired nucleus $^1H$.

A second mode is provided by the acquisition method comprising the steps of applying to the object a first radio-frequency magnetic pulse and a second radio-frequency magnetic pulse in sequence; applying, after applying the first and second radio-frequency magnetic pulses, to the object a first frequency-selective radiation pulse to excite a specific nucleus $^1H$ coupled to a desired nucleus $^1H$ through the homonuclear spin-spin coupling; applying, after applying the first frequency-selective radiation pulse, to the object a third radio-frequency magnetic pulse; applying, after applying the third radio-frequency magnetic pulse, to the object a second frequency-selective radiation pulse to excite the specific nucleus $^1H$; and acquiring, after applying the second frequency-selective radiation pulse, the magnetic resonance signal of the desired nucleus $^1H$.

A third mode is provided by the acquisition method comprising the steps of applying to the object a first radio-frequency magnetic pulse; applying, after applying the first radio-frequency magnetic pulse, to the object a first frequency-selective radiation pulse to excite a specific nucleus $^1H$ coupled to a desired nucleus $^1H$ through the homonuclear spin-spin coupling; applying, after applying the first frequency-selective radiation pulse, to the object a second radio-frequency magnetic pulse; applying, after applying the second radio-frequency magnetic pulse, to the object a second frequency-selective radiation pulse to excite the specific nucleus $^1H$; applying, after applying the second frequency-selective radiation pulse, to the object a third radio-frequency magnetic pulse; and acquiring, after applying the third frequency-selective radiation pulse, the magnetic resonance signal of the desired nucleus $^1$H.

In the above first to third modes, in replay to the application of the first frequency-selective radiation pulse, multiple-quantum coherences are generated. Then, in reply to the application of the second frequency-selective radiation pulse (in the case of the first and second modes) or the third radio-frequency magnetic pulse (in the case of the third mode), the single-quantum coherence is generated. This makes it possible to acquire a magnetic resonance signal of a desired nucleus $^1$H. Hence only a desired peak for a desired hydrogen nucleus $^1$H can be obtained in a spectrum. Further, because sensitivity in acquiring a signal according to this signal acquisition technique does not depend on phases of radio-frequency magnetic pulses, it is unnecessary to adjust such phases. Still further, the number of radio-frequency magnetic pulses to be applied for acquiring a magnetic resonance signal is four or five, which is a necessary minimum number. The system is therefore robust to errors in flip angles given to the pulses and signal loss resulted from radio-frequency magnetic distributions. Signal loss will not therefore be caused easily due to such factors.

In the configurations according to the above three modes, the application of the frequency-selective radiation pulses and radio-frequency magnetic pulses may be accompanied by the application of plural gradient pulses, and those plural gradient pulses may be determined to maintain a predetermined ratio of their intensities. By way of example, for the above first mode, it is preferred that a first gradient pulse is applied during a period of time lasting from a time at which the application of the first frequency-selective radiation pulse finishes to a further time at which the application of the second radio-frequency magnetic pulse starts, a second gradient pulse is applied during a period of time lasting from a time at which the application of the second radio-frequency magnetic pulse finishes to a further time at which the application of the second frequency-selective radiation pulse, and a third gradient pulse is applied during a period of time lasting from a time at which the application of the second frequency-selective radiation pulse finishes to a further time at which the acquisition of the magnetic resonance signal starts, wherein, when a time integral value of an intensity of the first gradient pulse is expressed by G1, a time integral value of an intensity of the second gradient pulse is expressed by G2, and a time integral value of an intensity of the third gradient pulse is expressed by G3, the time integral values G1, G2 and G3 are determined to meet a condition of 2G1−2G2−G3=0. This allows the gradient pulses to select desired coherence-transfer pathways, which makes the system robust highly to various unstable factors of the system, such as fluctuations in intensity of the radio-frequency magnetic pulses.

Furthermore, in the configurations according to the above three modes, it is also preferable that, of the plural radio-frequency magnetic pulses (for example, in the case of the first mode, the first and second radio-frequency magnetic pulses), at least one magnetic pulse is set as a slice-selective pulse applied concurrently with a slice gradient pulse. By employing this configuration, a magnetic resonance signal can be acquired from a one-dimensionally, two-dimensionally, or three-dimensionally localized region of an object to be examined.

Moreover, the foregoing three modes can be configured such that the hydrogen nuclei $^1$H included in γ-aminobutyric acid (GABA) present within the object and the desired nucleus $^1$H composes a GABA-4 coupled to a GABA-3 through the homonuclear spin-spin coupling.

On the other hand, as another category of the present invention, there are provided magnetic resonance systems capable of performing the acquisition methods based on the foregoing first to third modes. These systems are also able to provide a variety of advantages similarly to the above acquisition methods.

According to the present invention, there is also provided a recording medium in which a computer-readable program is stored which has the capability of performing the acquisition method according to the second mode.

BRIEF DESCRIPTION OF THE DRAWINGS

In the accompanying drawings:

FIG. 17 shows, according to a third example of a third embodiment of the present invention, a pulse sequence that uses three wide-bandwidth RF pulses to create multiple-quantum coherences so that a $J_{HH}$-coupled $^1H$ signal is acquired, together with a coherence-transfer pathway and a phase diagram both generated by performing the pulse sequence;

DETAILED DESCRIPTION OF PREFERRED EMBODIMENTS

Referring to accompanying drawings, embodiments according to the present invention will now be described. In the following embodiments, γ-aminobutyric acid (GABA; molecular formula=$H_2NCH_2CH_2CH_2COOH$) will be described as a substance having $J_{HH}$-coupled hydrogen nuclei $^1H$ to which the present invention is applicable. In addition, the signal acquisition according to the present invention can also be applied to other substances such as glutamic acid.

Figure 1:
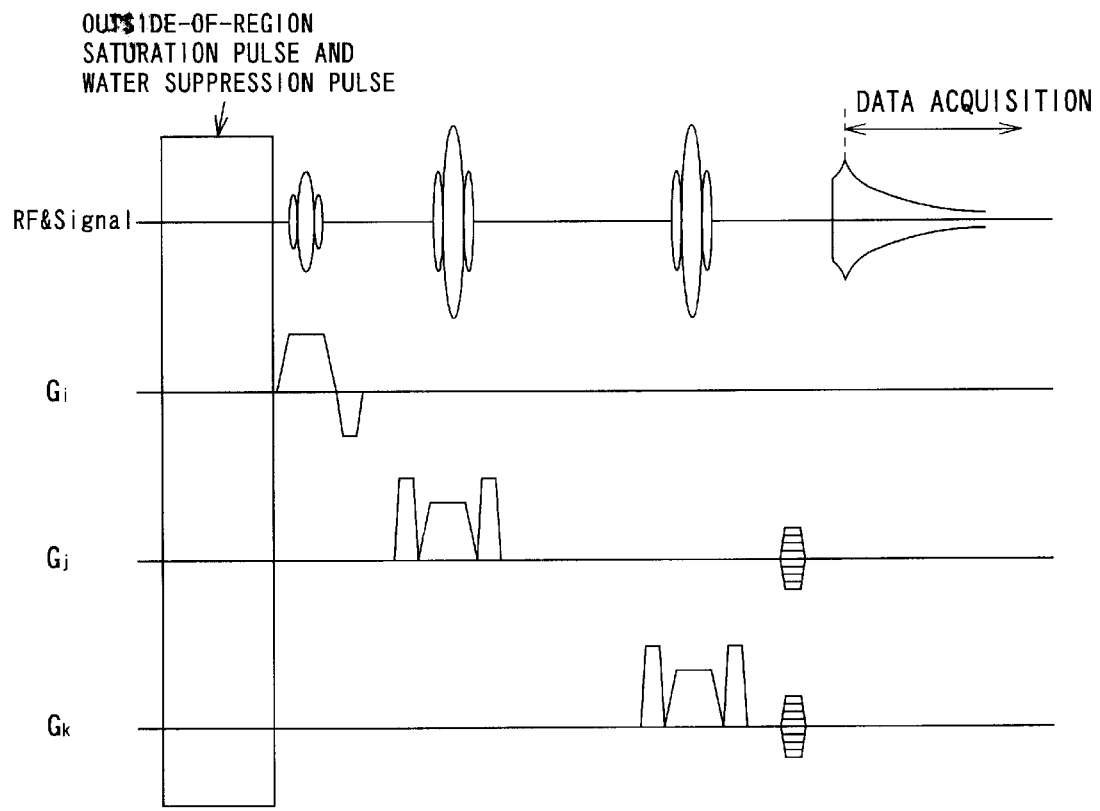
FIG. 1 is a pulse sequence showing the PRESS method explained as one conventional technique.
Figure 2:
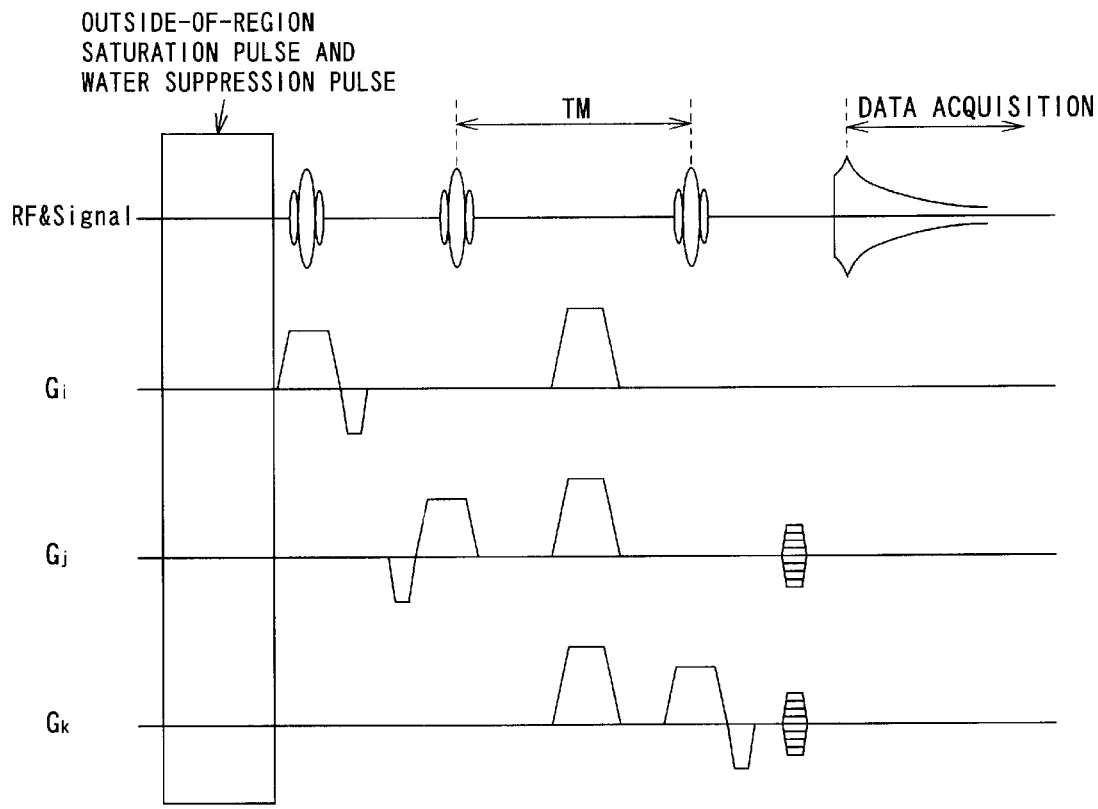
FIG. 2 is a pulse sequence showing the STEAM method according to another conventional technique.
Figure 3A:
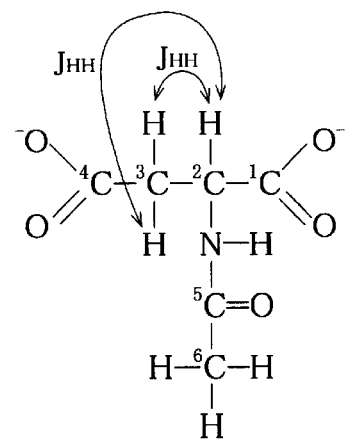
FIGS. 3A and 3B represents the molecular formulas of N-acetyl-aspartate (NAA) and γ-aminobutyric acid (GABA), respectively.
Figure 3B:
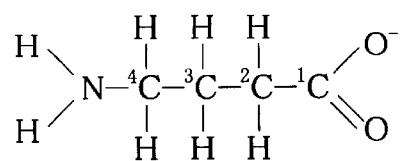
Figure 4A:
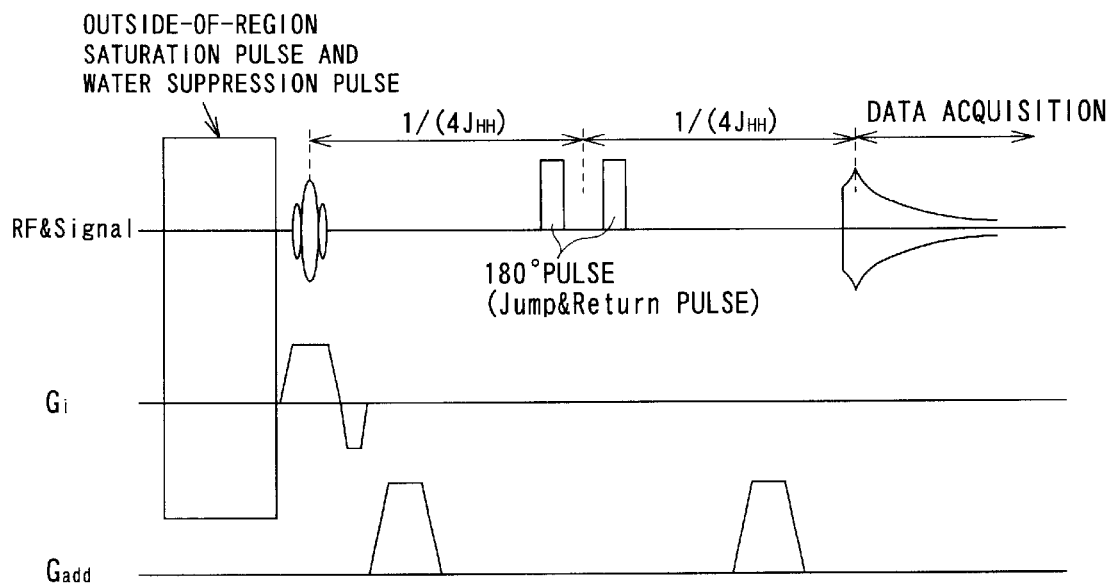
FIGS. 4A and 4B are pulse sequences showing one conventional technique of extracting only a $J_{HH}$-coupled $^1$H signal by performing a subtraction between a signal acquired with an SE pulse sequence and a further signal acquired with a further SE pulse sequence involving the application of DANTE pulses.
Figure 4B:
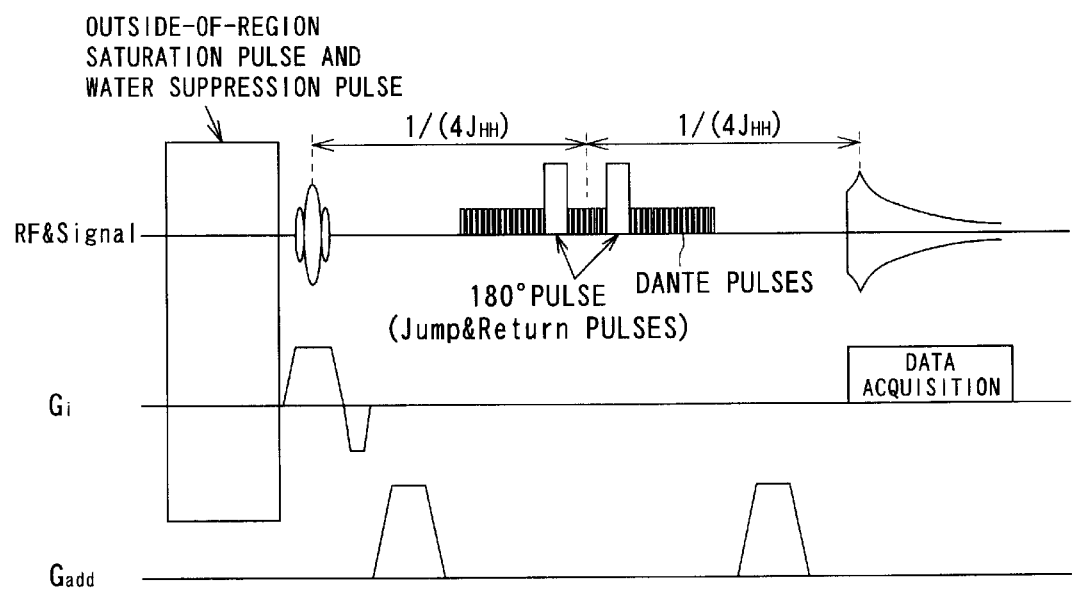
Figure 5A:
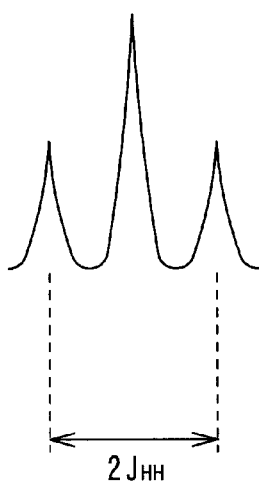
FIGS. 5A to 5C show patterns showing triplet spectrums obtained through pulse sequences.
Figure 5B:
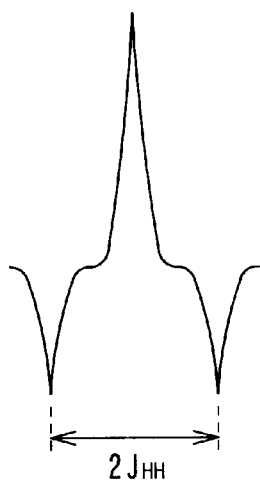
Figure 5C:
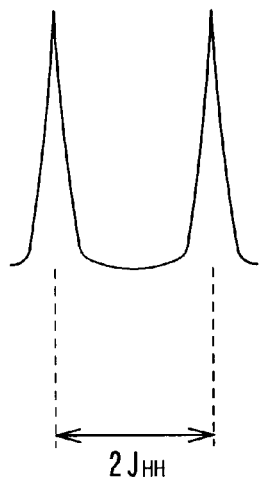
Figure 6:
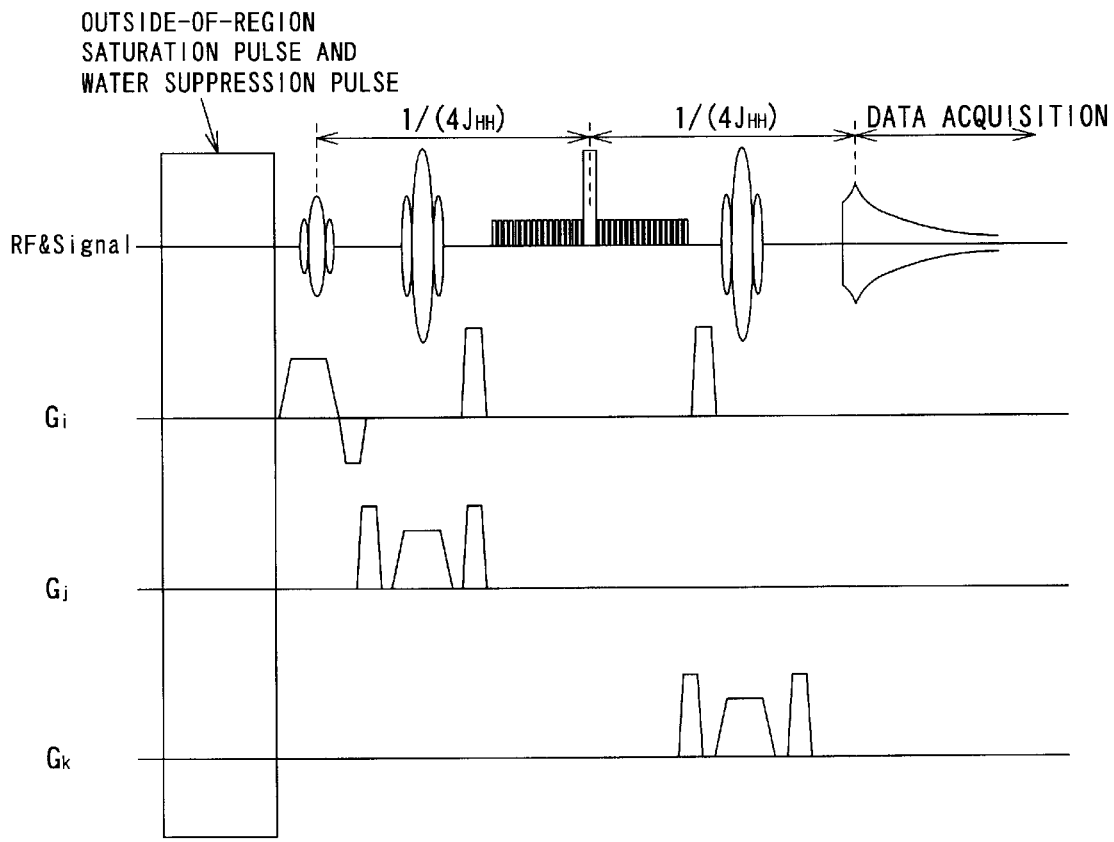
FIG. 6 shows, as one conventional technique, a pulse sequence improved from the pulse sequence shown in FIG. 4 so as to perform a three-dimensional localized excitation.
Figure 7:
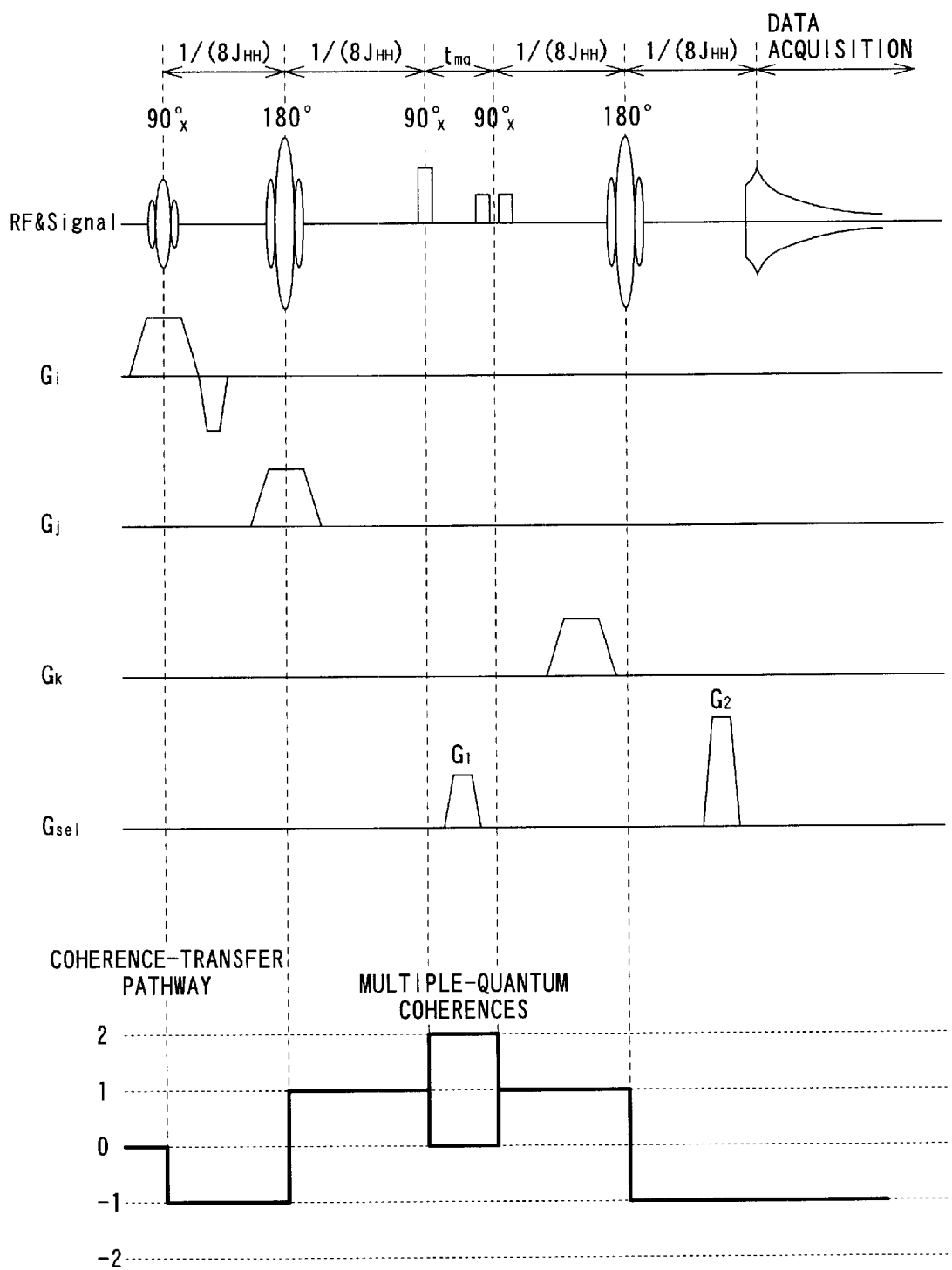
FIG. 7 explains, as one conventional technique, both a pulse sequence and a coherence-transfer pathway for extracting only a $J_{HH}$-coupled $^1$H signal through the creation of multiple-quantum coherences.
Figure 8:
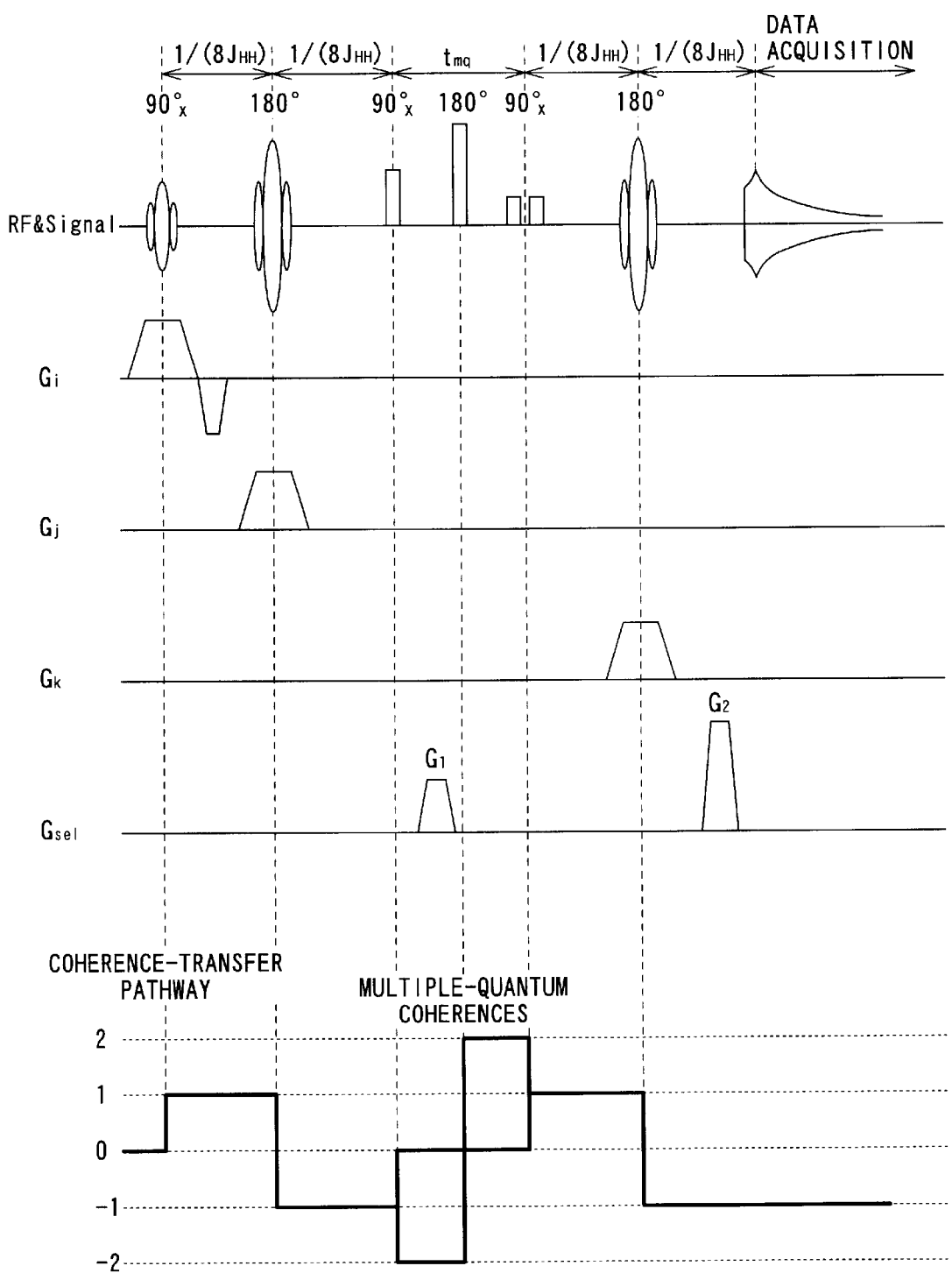
FIG. 8 explains, as another conventional technique, both a pulse sequence and a coherence-transfer pathway for extracting only a $J_{HH}$-coupled $^1$H signal through the creation of multiple-quantum coherences.
Figure 9:
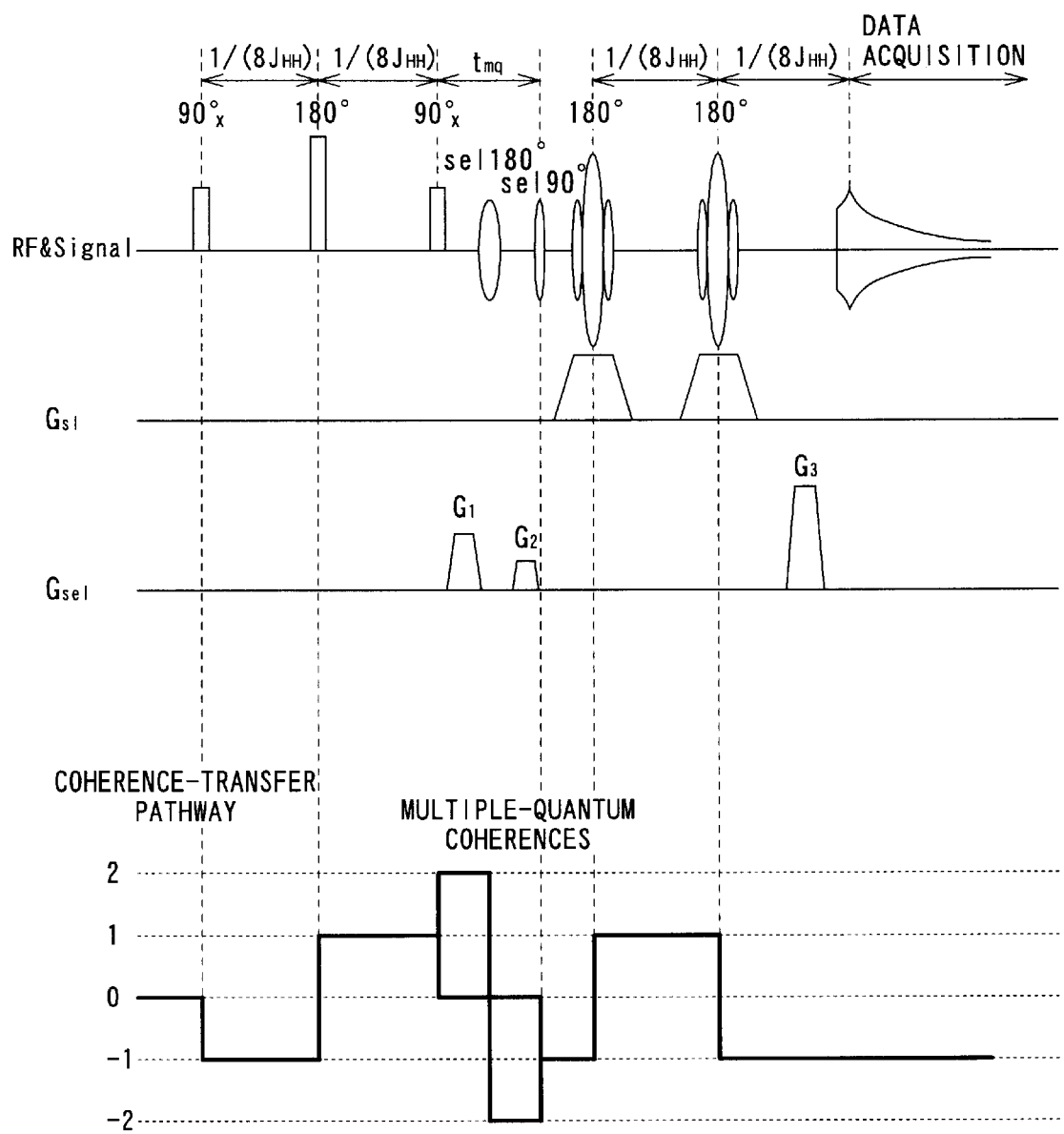
FIG. 9 explains, as another conventional technique, both a pulse sequence and a coherence-transfer pathway for extracting only a $J_{HH}$-coupled $^1$H signal through the creation of multiple-quantum coherences.
Figure 10:
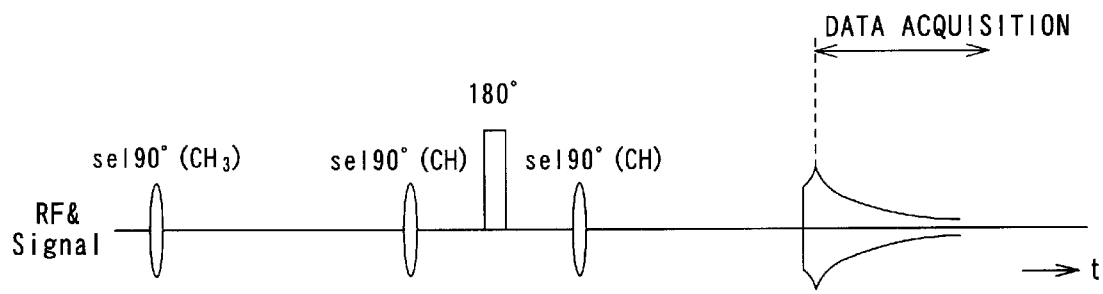
FIG. 10 explains, as another conventional technique, a pulse sequence for extracting only a $J_{HH}$-coupled $^1$H signal by making use of multiple-quantum coherences.
Figure 11:
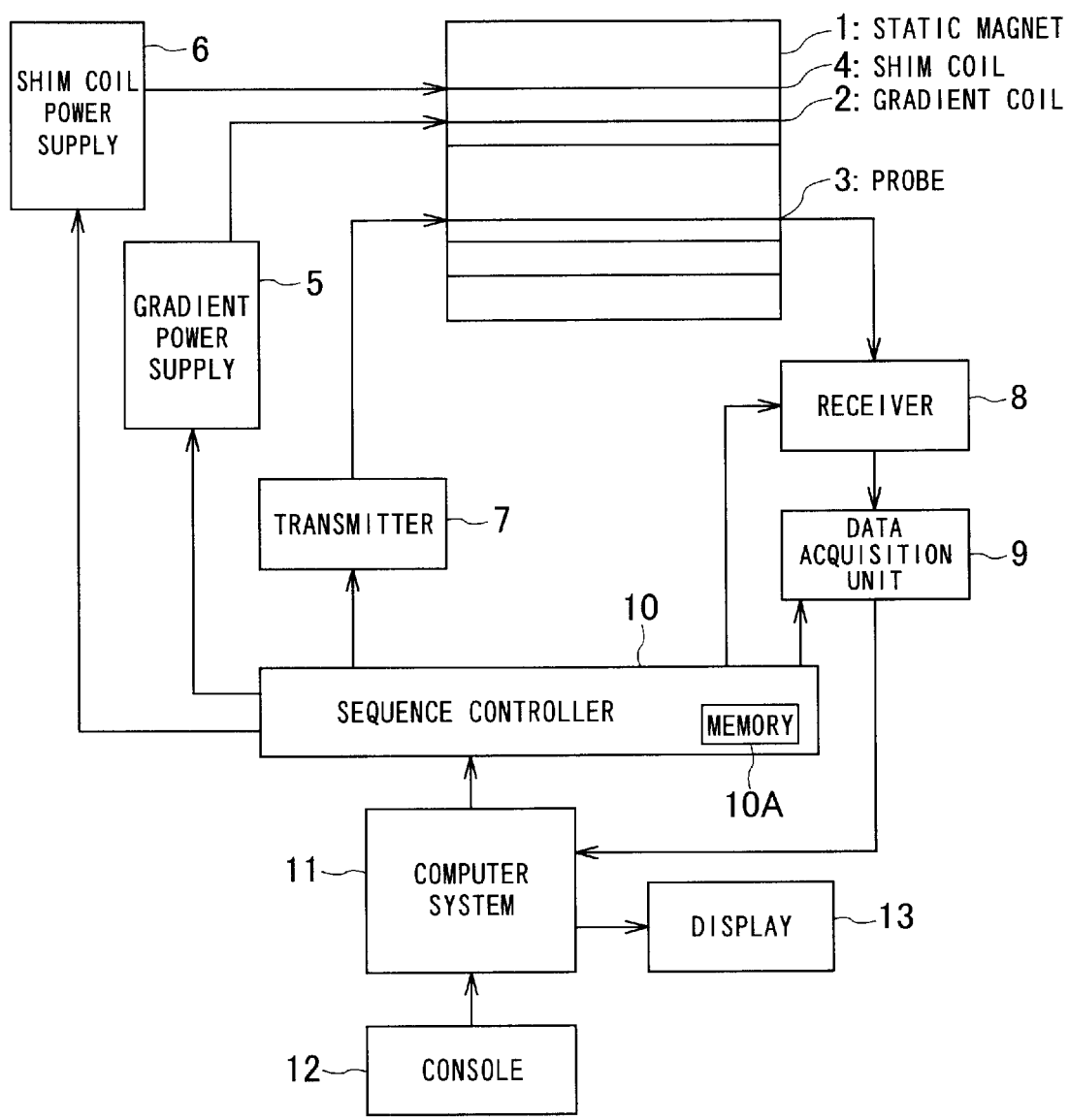
FIG. 11 is an outlined schematic diagram of a magnetic resonance system according to embodiments of the present invention.

FIG. 11 shows a block diagram of one embodiment according to a magnetic resonance system of the present invention. The present magnetic resonance system has the capability of performing MRS or MRSI.

The magnetic resonance system, as one example, has a superconducting type of static magnet 1 formed approximately into a cylinder, a gradient coil 2 equipped within the bore of the magnet 1, a probe 3 (RF coil), and a shim coil 4. The gradient coil 2 is connected to a gradient coil power supply 5, while the shim coil 4 is connected to a shim coil power supply 6. The probe 3 is coupled with both of a transmitter 7 and a receiver 8, which are in charge of transmission and reception of RF signals, respectively. The receiver 8 is routed via a data acquisition unit 9 to a computer system 11. The power supplies 5 and 6, transmitter 7, receiver 8, and data acquisition unit 9 are controlled by the computer system 11 when a pulse sequence is carried out. The computer system 11 is connected with both a console 12 and a display 13.

The above constituents will now be detailed together with their operations. Both the static magnet 1 and the gradient coil 2 and shim coil 3 incorporated in the bore of the static magnet 1 operate in such a manner that both a static magnetic field and gradient magnetic fields having linear gradient distributions in the mutually-orthogonal x-, y- and z-axes are applied to a not-shown object inserted into the bore (imaging spacing). The gradient coil 2 is driven by the gradient coil power supply 5, while the shim coil 4 is driven by the shim coil power supply 6.

The probe 3 placed on the inner side of the gradient coil 2 operates to apply a radio-frequency (RF) magnetic field to the object in response to reception of a radio-frequency signal from the transmitter 7 and to receive a magnetic resonance signal from the object. The probe 3 may be provided individually for each of transmission and reception. A magnetic resonance signal received at the probe 3 is detected by the receiver 8, transferred to the data acquisition unit 9 in which the signal is A/D-converted, then sent to the computer system 11 in which the digitized data are subject to predetermined data processing.

The operations of the gradient coil power supply 5, shim coil power supply 6, transmitter 7, receiver 8 and data acquisition unit 9 are controlled by the sequence controller 10. The sequence controller 10 operates in response to commands issued from the computer system 11. The sequence controller 10 is provided with a memory 10A that serves as a recording medium according to the present invention. The memory 10A is able to memorize information about a pulse sequence, which is given by the computer system 11, used in each embodiment.

The computer system 11 operates in reply to commands given from the console 12. The magnetic resonance signal sent from the data acquisition unit 9 to the computer system 11 is then subjected to post processing, including a Fourier transform that serves as reconstruction processing. From the post-processed signals, spectrum data or image data of desired nuclear spins of an object are obtained. The spectrum data or image data are sent to the display 13 for their display.

In the present embodiment, a pulse sequence, which is carried out in a cooperative manner by the foregoing computer system 11 and sequence controller 10, will now be described.

In the following, as an object to be observed by the pulse sequence, hydrogen nuclei $^1H$ of the GABA-4 will be described. As descried in the prior related art, the GABA-4 shows triplet peaks due to the $J_{HH}$ coupling to the GABA-3, and a difference in the frequencies between the outside two peaks along the frequency axis agrees with double the $J_{HH}$. In the pulse sequences related to the present invention, which will be described based on this frequency difference, this period of time of "$2J_{HH}$" plays a significant role as the criterion for setting a period of time between radio-frequency magnetic pulses. In contrast, a system $J_{HH}$-coupled to only one $^1H$ reveals doublet peaks, of which frequency difference corresponds to a period of time of $J_{HH}$. In such a system, a significant criterion for setting a period of time is $J_{HH}$. However, the pulse sequence according to the present invention, which will be explained concerning editing of the GABA-4, can also be applied to the system involving the period of time of $J_{HH}$.

Figure 12:
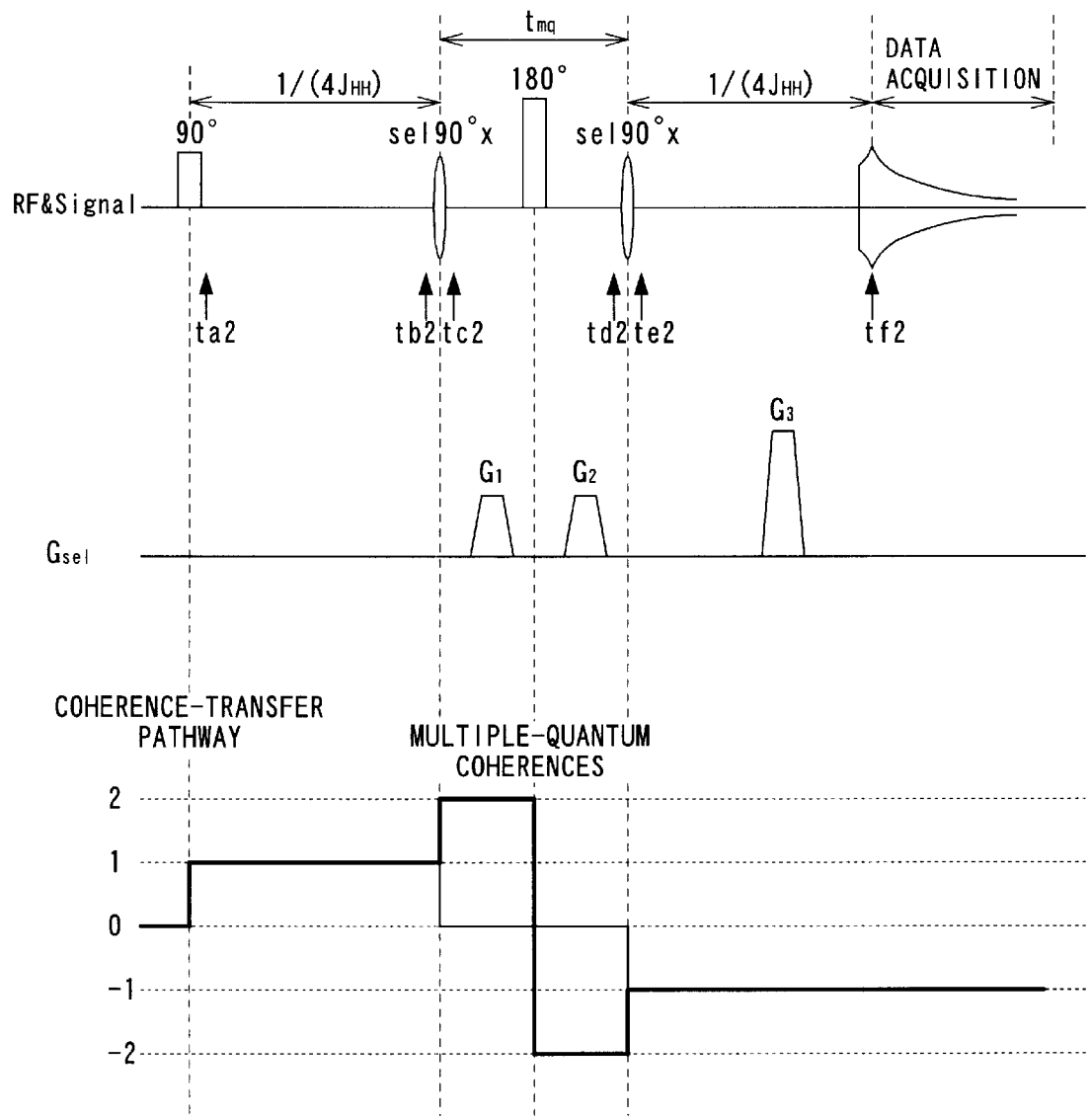
FIG. 12 shows, according to a first embodiment of the present invention, both of a pulse sequence for acquiring a $J_{HH}$-coupled $^1$H signal through the creation of multiple-quantum coherences and the pathway of coherence transfers generated by performing the pulse sequence.

FIG. 12 shows a pulse sequence according to the present embodiment, in which the pulse sequence corresponds to the fundamental form based on the present invention. For performing the pulse sequence, a 90° RF pulse is first applied.

Figures 13A, 13B:
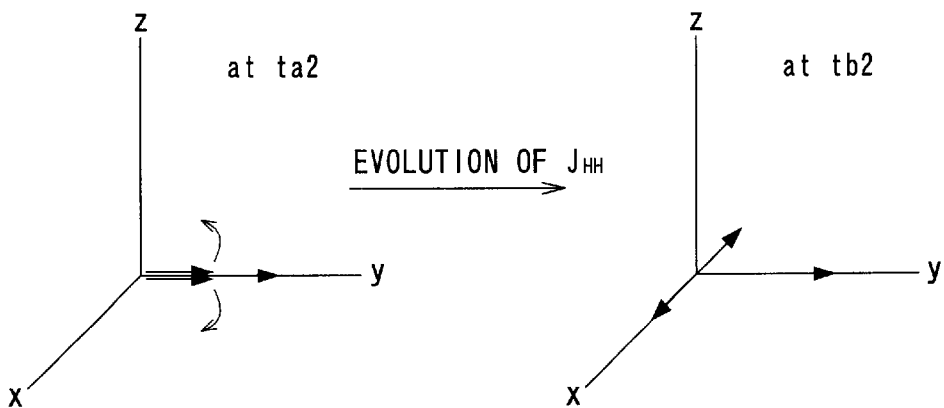
FIGS. 13A to 13F illustrate in vectors the behaviors of two hydrogen nuclei $^1$H and a single $J_{HH}$-coupled hydrogen nucleus $^1$H.
Figures 13C, 13D:
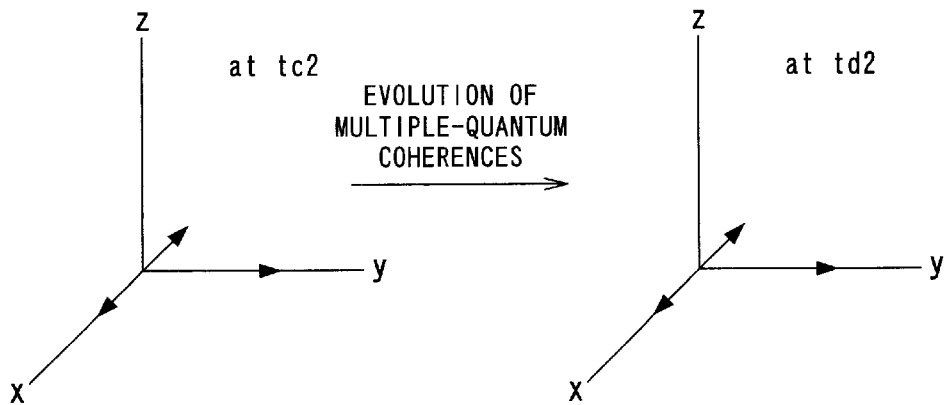

This application causes the $J_{HH}$ coupling to be evolved between the GABA-3 and the GABA-4 (refer to FIG. 13A), thus the outside two peaks are completely inverted at a time tb2 when a period of time of "¼$J_{HH}$" elapsed from the application. This inversion is shown in FIG. 13B. FIGS. 13A to 13F show models of behaviors of the triplet peaks, in which evolutions resulting from non-uniformity of the static field is not taken into account, because such evolution is re-imaged by a 180° pulse to be applied during a period of time arranged for generating multiple-quantum coherences.

For a generalized form, the foregoing time tb2 is given as a temporal instant when a period of time corresponding to "(2m+1)/2n" times as large as an inverse number of the constant $J_{HH}$ elapses from the application of the 90° RF pulse, in which m=0, 1, 2, 3, . . . and n is the number of $^1H$ spins coupled to a desired hydrogen nucleus $^1H$.

At the time tb2, a first frequency-selective radiation pulse "sel 90° pulse x" is applied. This pulse is a radio-frequency magnetic pulse that is responsible for frequency-selective excitation of the GABA-3 to which the desired GABA-4 is $J_{HH}$-coupled. This application generates multiple-quantum coherences between the GABA-3 and GABA-4, that is, the zero-quantum coherence and the double-quantum coherences (refer to FIG. 13C). After a specific period of time, a 180° RF pulse is applied to re-image the evolutions chemical shifts and non-uniformity of the static field. Then, a second frequency-selective radiation pulse "sel 90° pulse x" directed to frequency-selective excitation of the GABA-3 is again applied (refer to FIG. 13D). This application creates the single-quantum coherence of the GABA-4, making a magnetic resonance signal observable.

Figures 13E, 13F:
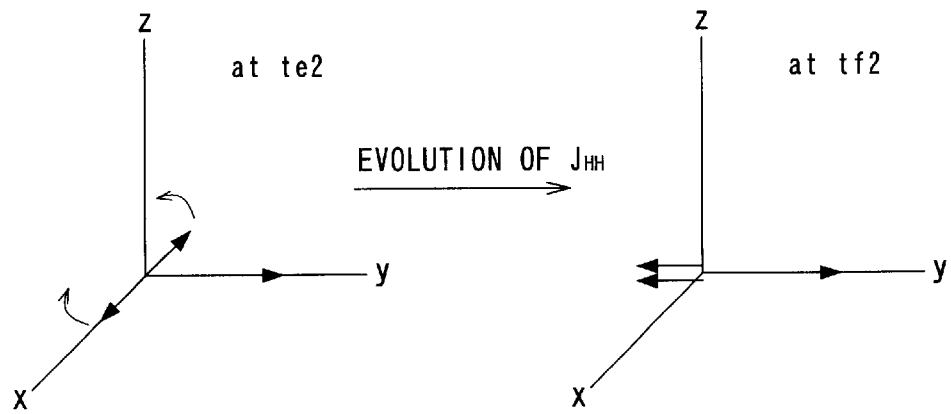

After this application, the coupling $J_{HH}$ begins evolving again (refer to FIG. 13E), and at a time after a period of time of "¼$J_{HH}$" elapses, a spectrum is obtained in which the outside two peaks are inverted (refer to FIG. 13F). FIG. 12 additionally shows a series of coherence-transfer pathways generated during the performance of the pulse sequence shown therein. The orders of the coherences change in the order of "1, 2, –2, to –1," so that the coherence order of "–1" observable by a detection mechanism is provided finally.

The foregoing signal acquisition technique has the advantages over the conventional various techniques. The advantages are as follows.

First, because the first excitation pulse (90° RF pulse) is formed into a wideband (frequency-non-selective) pulse, an echo signal can be acquired from the GABA-4, even when a plurality of $^1H$ compounds in the GABA are excited. This pulse relieves cumbersome operations imposed on an operator in adjusting the frequency of the first excitation pulse. Additionally, because the first RF excitation pulse is wide in frequency band, its wavelength becomes shorter than a narrow-band RF pulse. As a result, the slice gradient pulse applied concurrently with the first RF excitation can be set to a higher intensity compared to that for a narrow-band RF pulse, with the result that resistance to magnetic non-uniformity becomes hither.

In the case of the signal acquisition technique according to the present embodiment, the phases of the radio-frequency magnetic pulses do not affect the sensitivity of signals to be detected. First of all, the phases of the non-selective 90° pulse and 180° pulse do not become a critical matter. Further, though the phases of both of the two frequency-selective radiation pulses are set to an amount of "x" as shown in FIG. 12, no problem will occur even when there is a difference in phase between the two pulses. When the GABA-4 is in the state shown in FIG. 13B, the signal acquisition technique according to the present embodiment allows the first frequency-selective radiation pulse "sel 90° pulse" to excite only the $^1H$ of the GABA-3 to which the $J_{HH}$ coupling is made, thereby generating the multiple-quantum coherences. Accordingly, the GABA-4 will not be influenced by phase differences, so that the efficiency of generating the multiple-quantum coherences will be lowered. Moreover, the second frequency-selective radiation pulse "sel 90° pulse" changes only the $^1H$ of the GABA-3 into its longitudinal magnetization in order to generate the single-quantum coherence of the GABA-4. That is why the phases of the radio-frequency magnetic pulses do not have the influence on the efficiency of making the multiple-quantum coherences transfer to the single-quantum coherence.

Furthermore, the signal acquisition technique allows the selection of coherences to be done with the gradient pulses. As shown in FIG. 12, a gradient pulse G1 is applied between the first frequency-selective radiation pulse "sel 90° x (x: RF phase)" and the 180° RF pulse, whereas a gradient pulse G2 is applied between the 180° RF pulse and the second frequency-selective radiation pulse. Besides these pulses, a gradient pulse G3 is applied between the second "sel 90° x" pulse and the data acquisition. When periods of time during which the gradient pulses are applied are t1, t2 and t3, the gradient strengths are determined to satisfy an expression of $$p1\int_0^{t1} G1 dt + p2\int_0^{t2} G2 dt + p3\int_0^{t3} G3 dt = 0 \qquad (1),$$

so that a desired coherence-transfer pathway can be selected.

Because the observable coherence order is "–1," a condition of $$p1\int_0^{t1} G1 dt + p2\int_0^{t2} G2 dt - \int_0^{t3} G3 dt = 0 \qquad (2)$$

is realized. For the sake of a simplified understanding, it can be assumed that G1, G2 and G3 are independent of the time, the condition being rewritten as follows.

$$p1 G1 t1 + p2 G2 t2 - G3 t3 = 0 \qquad (3)$$

Suppose that the coherence-transfer pathways are chosen to trace only bold lines shown in FIG. 12. Since there are provided such that $$p1 = +2, p2 = -2$$

, the condition can be rewritten to $$2(G1 t1 - G2 t2) - G3 t3 = 0 \qquad (4).$$

As a result, for example, if defining so that "G1t1:G2t2:G3t3=1:0:2" is satisfied, it is possible to select desired coherence-transfer pathways alone. Thus, water and Cr of which chemical shift is 3.0 ppm can be dephased, their signals being suppressed. Therefore, it is possible that robust observation is performed without being depending on unstableness of a system. Moreover, observation of phase cycles of the "sel 90°" pulses enables a further suppression of the spectrum peaks at water and Cr resonance frequencies. A water-signal suppressing pulse, such as a CHESS pulse, may be applied as a preparation pulse to gain a further suppression of the water signal.

There are still advantages in the present embodiment. The foregoing signal acquisition technique uses the frequency-selective radiation pulses to generate the multiple-quantum coherences, which enables the extraction of only desired spectrum peaks. That is why only the GABA-4 can be edited in the foregoing embodiment. This editing therefore prevents spectrum peaks caused by NAA-2 or others from appearing in the spectrum, thereby avoiding a complicated analysis of the spectrum.

The foregoing signal acquisition technique uses four radio-frequency magnetic pulses, as described above, which is a necessary minimum number of pulses. Accordingly, it still provides a pulse sequence which is robust to errors in setting the flip angles and differences in radio-frequency magnetic distributions, that is, remarkably reluctant to signal loss due to those unstable factors.

(Second Embodiment)

A second embodiment of the present invention will now be described. The present embodiment provides an example configured by developing the pulse sequence shown in FIG. 12 into a spatial two-dimensional pulse sequence.

Figure 14:
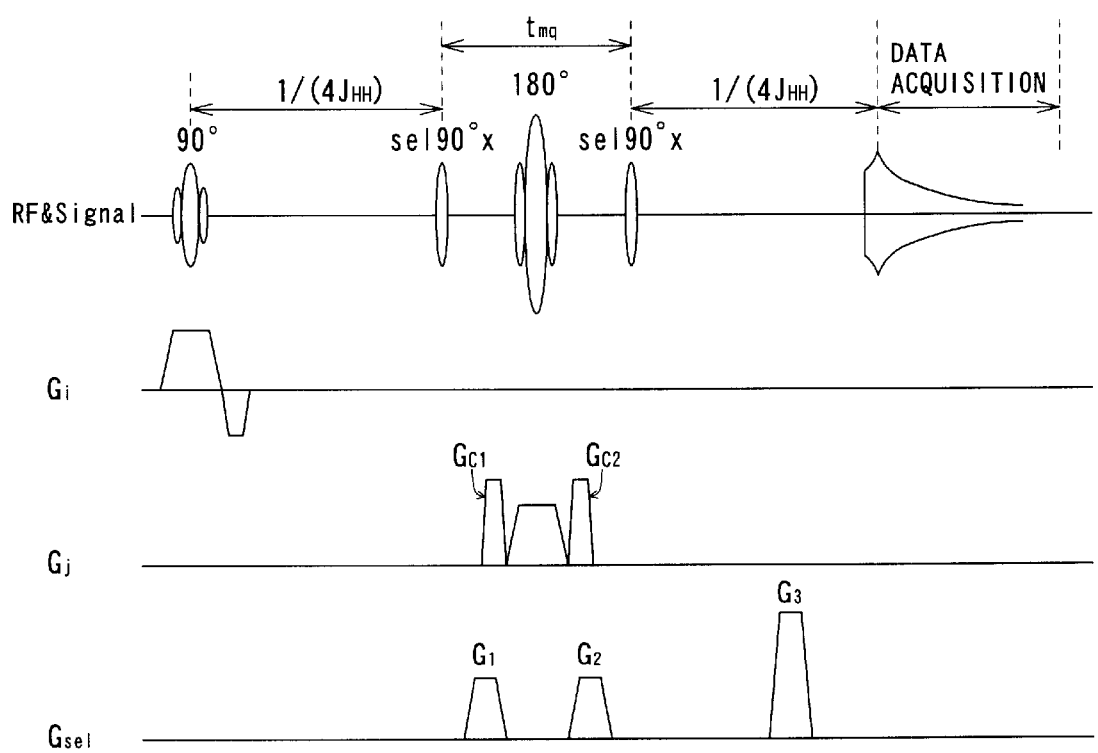
FIG. 14 shows, according to a second embodiment of the present invention, a pulse sequence for extracting only a $^1$H signal $J_{HH}$-coupled within a spatially-localized two-dimensional excited region.

A pulse sequence according to the present embodiment is shown in FIG. 14, in which both the 90° RF pulse and the 180° RF pulse explained in FIG. 12 are used as slice-selective RF pulses applied concurrently with slice gradient pulses to be applied in different axes.

Specifically, a slice 90° RF pulse is first applied to excite $^1H$ spins residing within a slice orthogonal to the i-axis, resulting in that the $J_{HH}$ coupling evolves. A frequency-selective radiation pulse directed to the GABA-3, which is applied in succession, creates multiple-quantum coherences between the GABA-3 and the GABA-4 that are present in the foregoing slice. A slice 180° RF pulse is applied in succession to a slab formed at a crossed region of the foregoing slice and a slice perpendicular to the j-axis. The slice 180° RF pulse causes the order of the double-quantum coherences between the GABA-3 and the GABA-4 residing within the slab to change from "+2 to –2." After this, a further frequency-selective radiation pulse applied to the GABA-3 creates the single-quantum coherence of the GABA-4 within the slab, thus making a magnetic resonance signal from the GABA-4 observable. In addition, coherence-selection gradient pulses for suppressing signals from water and Cr are applied during this pulse sequence, which allows the coherence transfer to selected along pathways of "+1, +2, –2, and –1." Thus, spatially localized two-dimensional excitation can be done.

Crusher pulses Gc1 and Gc2 (also referred to as spoiler pulses) are applied before and after the 180° RF pulse during a period of time of $t_{mq}$ assigned to the generation of the multiple-quantum coherences. As shown in FIG. 14, if it is determined that time integral values of both the crusher pulses are equal to each other, the conditions of G1t1=G2t2 and G3=0 are established, so that the foregoing condition (4) is satisfied. Thus, if the coherence-selection gradient pulses are determined to meet the condition (4) independently of the crusher pulses, the signals from water and Cr can be suppressed and only the GABA-4 can be subjected to the signal detection.

(Third Embodiment)

A third embodiment of the present invention will now be described. The present embodiment is concerned with a pulse sequence for the spatial three-dimensional localization. Some fundamental pulse sequences are shown in FIGS. 15 to 17.

Figure 15:
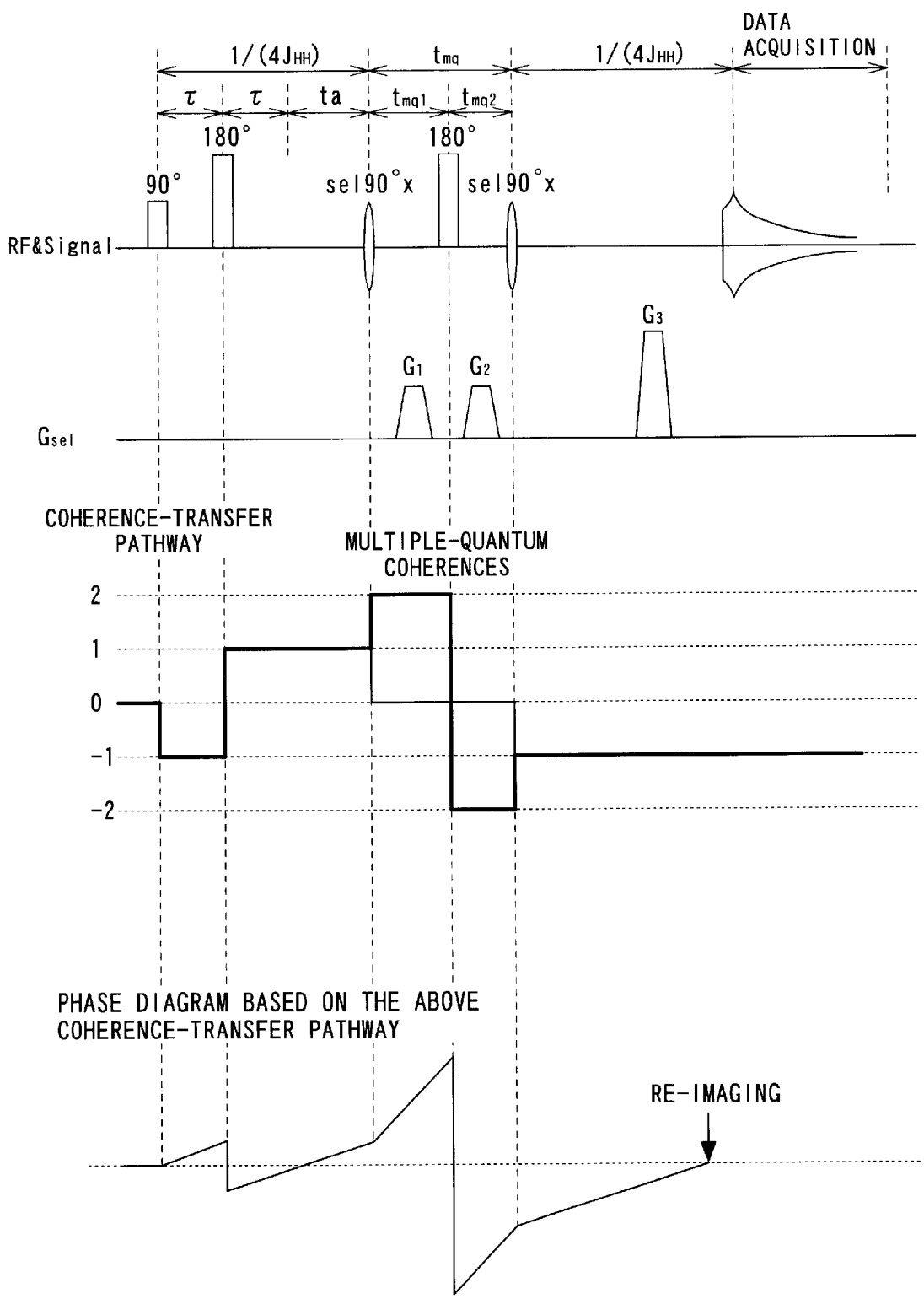
FIG. 15 shows, according to a first example of a third embodiment of the present invention, a pulse sequence that uses three wide-bandwidth RF pulses to create multiple-quantum coherences so that a $J_{HH}$-coupled $^1H$ signal is acquired, together with a coherence-transfer pathway and a phase diagram both generated by performing the pulse sequence.
Figure 16:
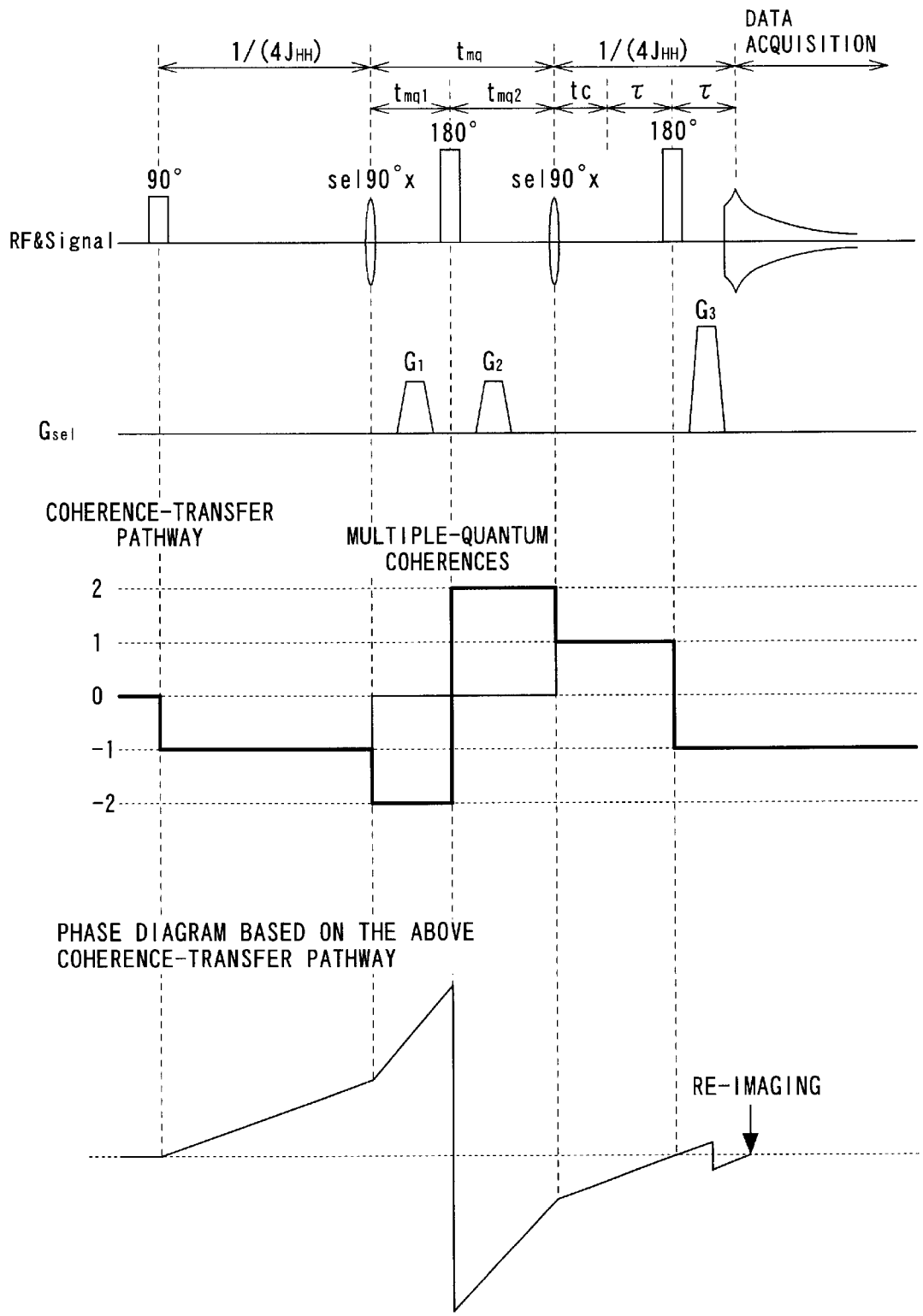
FIG. 16 shows, according to a second example of a third embodiment of the present invention, a pulse sequence that uses three wide-bandwidth RF pulses to create multiple-quantum coherences so that a $J_{HH}$-coupled $^1H$ signal is acquired, together with a coherence-transfer pathway and a phase diagram both generated by performing the pulse sequence.

A first example is shown in FIG. 15, which provides a fundamental pulse sequence in which both a 90° RF pulse and a 180° RF pulses are applied in turn before the generation of multiple-quantum coherences. In contrast, both of a second example shown in FIG. 16 and a third example shown in FIG. 17 provide configurations in each of which a 180° RF pulse is applied after establishment of the single-quantum coherence that follows the multiple-quantum coherences. The pulse sequences according to the three techniques use three radio-frequency magnetic pulses, that is, the 90° RF pulse and the first and second 180° RF pulses. Therefore, to provide the three pulses as slice-selective pulses makes it possible to excite a three-dimensional localized region.

FIRST EXAMPLE

In the pulse sequence shown in FIG. 15, a first 90° RF pulse is first applied, which is followed by a 180° RF pulse applied after a period of time of τ from the application of the 90° RF pulse. The 180° RF pulse causes non-uniformity of the static field to be re-imaged after another period of time of τ from the application of the 180° RF pulse. But the 180° RF pulse causes all the $J_{HH}$-coupled $^1H$ to be inverted, thus the coupling $J_{HH}$ experiencing its evolution. After a period of $¼J_{HH}$ from the application of the 90° RF pulse, a frequency-selective radiation pulse "sel 90° x" dedicated to frequency-selective excitation of the GABA-3 is applied. Like the generation through the pulse sequence shown in FIG. 12, multiple-quantum coherences can be generated efficiently, without dependency on the phases of the RF magnetic pulses. After a period of time of $t_{mq1}$ from the application of the frequency-selective RF pulse, a 180° RF pulse is applied to re-image chemical shifts and non-uniformity of the static field. Further, after a period of time of tmq2 from the application of the 180° RF pulse, a second frequency-selective radiation pulse "sel 90° x" dedicated to frequency-selective excitation of the GABA-3 is applied again. In reply to this application, the multiple-quantum coherences transfer to the single-quantum coherence, thus a magnetic resonance signal from the GABA-4 being observable.

In the case of the pulse sequence in FIG. 15, to determine the coherence-selection gradient pulses that meet the foregoing condition (4) allows the coherence transfers to trace the bold-line pathways shown in FIG. 15. Accordingly, signals from the water and Cr can be suppressed.

When the pulse sequence shown in FIG. 15 is used, it is required that the periods of time be determined so as to re-image chemical shifts and non-uniformity of the static field. For this explanation, in addition to the periods τ, $t_{mq1}$ and $t_{mq2}$, a period of time of ta is defined as follows.

$$2\tau + ta = 1/(4J_{HH}) \qquad (5)$$

As shown in FIG. 15, the coherences have the order of +1 during a period (τ, ta) ranging from the first 180° RF pulse to the first frequency-selective RF pulse "sel 90° x," the order of +2 during a period ($t_{mq1}$) ranging from the first frequency-selective RF pulse "sel 90° x" to the second 180° RF pulse, –2 during a period ($t_{mq2}$) ranging from the second 180° RF pulse to the second frequency-selective RF pulse "sel 90° x," and –1 after the second frequency-selective RF pulse "sel 90° x," respectively. Hence, setting the periods to meet the following condition (6) makes it possible to re-image chemical shifts and non-uniformity of the static field.

$$ta + 2t_{mq1} - 2t_{mq2} - 1/(4J_{HH}) = 0 \qquad (6)$$

A phase diagram obtained during the performance of the above pulse sequence is shown in FIG. 15 as well.

The above expression can also be developed to $$-2\tau + 2t_{mq1} - 2t_{mq2} = 0 \qquad (7),$$

so that, if the periods of time to the radio-frequency magnetic pulses are determined to satisfy the expression (7), chemical shifts and non-uniformity of the static field can be re-imaged.

SECOND EXAMPLE

FIG. 16 shows a pulse sequence according to a second example, in which a 180° RF pulse (a second one) is applied after multiple-quantum coherences are made to transfer into the single-quantum coherence. In this pulse sequence, a period of time from a second frequency-selective radiation pulse "sel 90° x (x: RF signal phase)" to the second 180° RF pulse is determined to be longer than that from the second 180° RF pulse to the start of data acquisition, and a difference between those periods is defined to be tc. A train of partial pulses in this pulse sequence, which includes pulses from the first one to the second frequency-selective radiation pulse "sel 90° x," is identical to those shown in FIG. 12. This arrangement of the pulses is also able to generate the multiple-quantum coherences.

A 180° RF pulse is applied, as shown in FIG. 16, to re-image chemical shifts and non-uniformity of the static field. This is followed by the application of the second frequency-selective radiation pulse "sel 90° x," so that the single-quantum coherence is generated. Responsively to this generation, the coupling $J_{HH}$ begins evolving, as shown in FIGS. 13E to 13F. Namely, the outside-located two peaks emanating from the GABA-4, of which phases are inverted 180 degrees to each other at immediately after the application of the second frequency-selective radiation pulse "sel 90° x" (refer to the vector model in FIG. 13E), transfer to an in-phase state after a period of $¼J_{HH}$ (refer to the vector model in FIG. 13F). Like the pulse sequence in FIG. 15, it is required for the pulse sequence in FIG. 16 that the periods of time to the pulses be considered. When those periods are determined to fulfill the following expression (8), chemical shifts and non-uniformity of the static field can be re-imaged.

$$-1/(4J_{HH})-2t_{mq1}+2t_{mq2}+tc=0 \quad (8)$$

Alternatively, using $tc=(¼J_{HH})-2\tau$, this expression (8) can be rewritten to $$-2t_{mq1}+2t_{mq2}-2\tau=0 \quad (9),$$

so that it is enough that the periods meet the expression (9).

When the coherence-selection gradient pulses are determined to satisfy the following expression (10), coherence-transfer pathways shown in FIG. 16 can be given.

$$-2(G1t1-G2t2)-G3t3=0 \quad (10)$$

THIRD EXAMPLE

A pulse sequence shown in FIG. 17 provides a third example. In this pulse sequence, unlike the pulse sequence in FIG. 16, a period of time from the second 180° RF pulse to the start of data acquisition is determined to be longer than that from a second frequency-selective radiation pulse "sel 90° x" to the second 180° RF pulse, and a difference between those periods is defined to be tc. In this case, if the periods of time are determined to meet the following expression (11), chemical shifts and non-uniformity of the static field can be re-imaged.

$$-1/(4J_{HH})-2t_{mq1}+2t_{mq2}-tc=0 \quad (11)$$

Alternatively, using $tc=(¼J_{HH})-2\tau$, this expression (11) can be changed to $$-2t_{mq1}+2t_{mq2}+2\tau-1/(2J_{HH})=0 \quad (12),$$

so that it is enough that the periods meet the expression (12).

If a condition of $t_{prep}=¼J_{HH}$ is defined, the above formulas can be expressed by $$-2t_{mq1}+2t_{mq2}+2\tau-2t_{prep}=0 \quad (13).$$

When the coherence-selection gradient pulses are determined to satisfy the foregoing expression (10), coherence-transfer pathways shown in FIG. 17 can be given.

(Fourth Embodiment)

Figure 18:
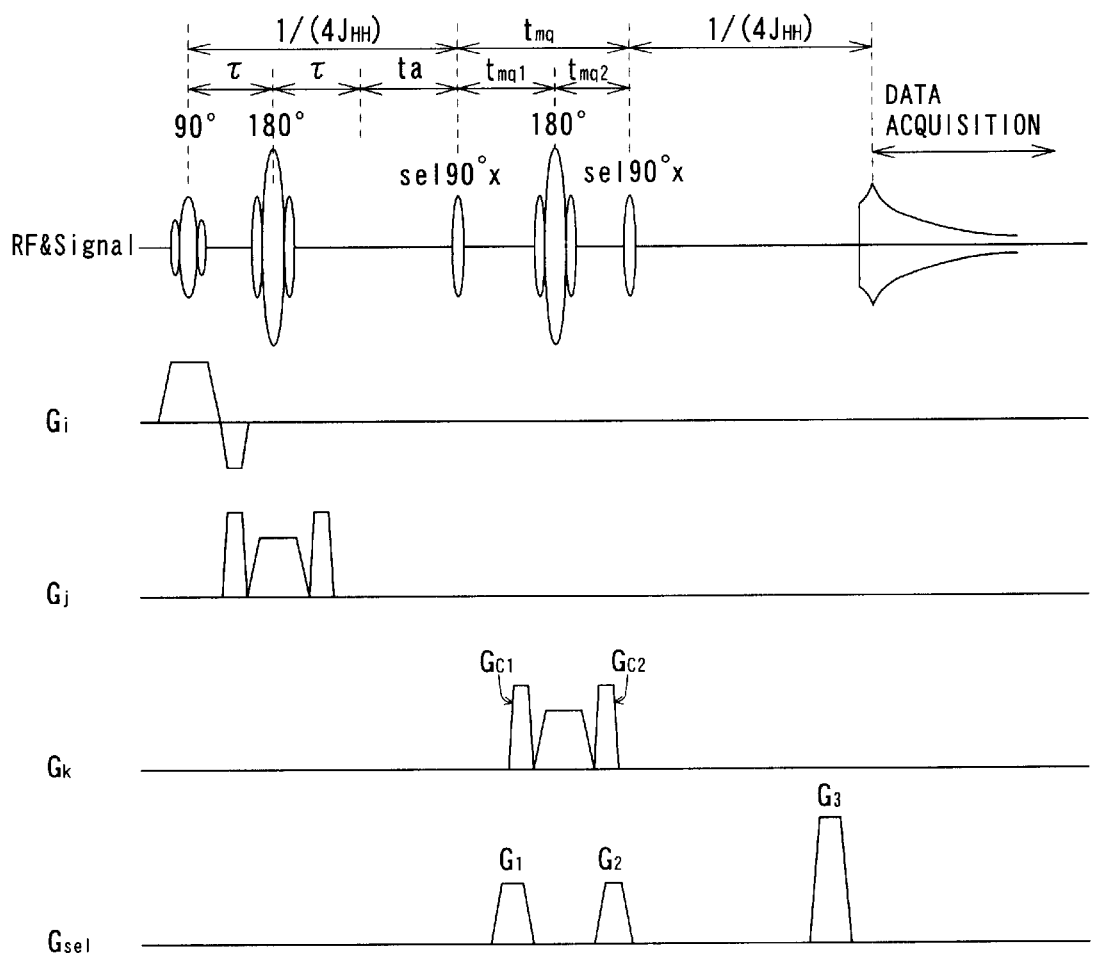
FIG. 18 shows, according to a first example of a fourth embodiment of the present invention, a pulse sequence for extracting only a $^1H$ signal $J_{HH}$-coupled within a spatially-localized three-dimensional excited region.
Figure 19:
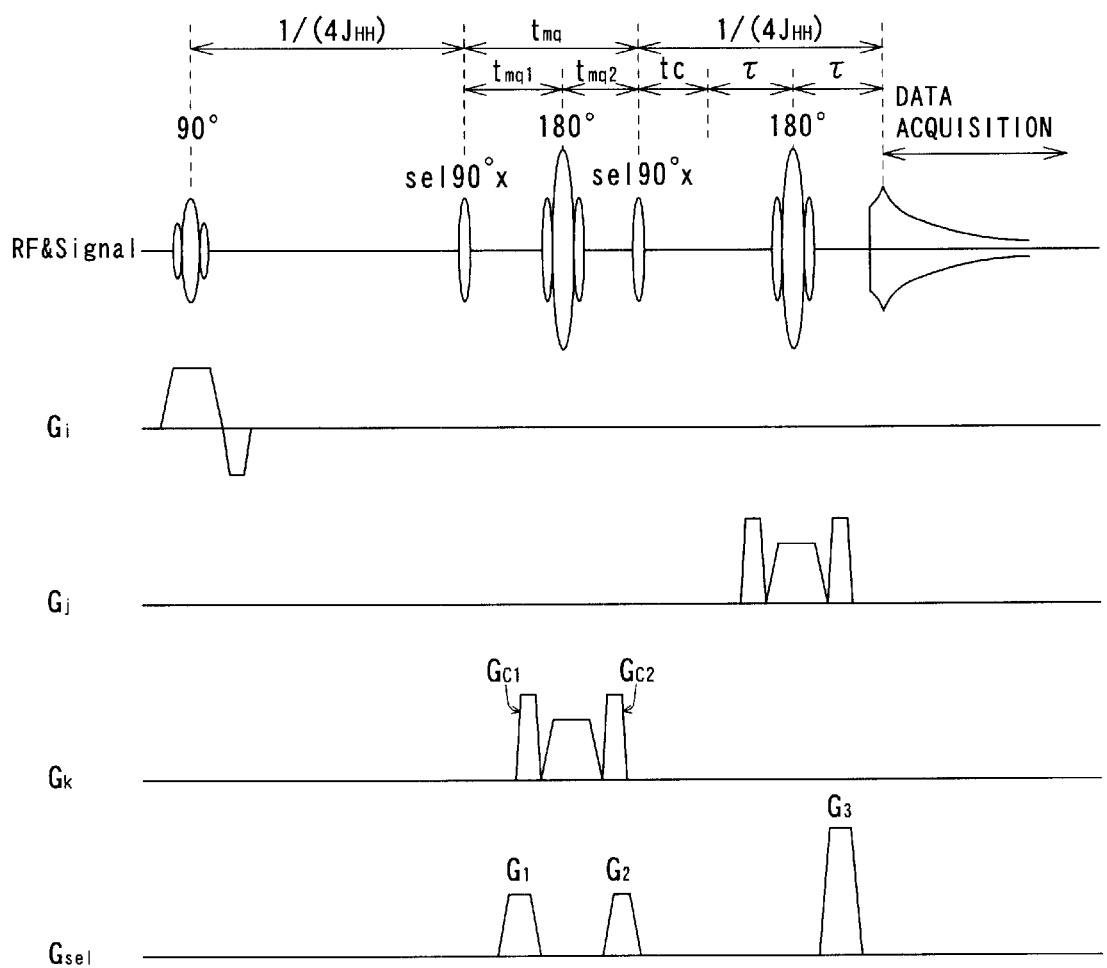
FIG. 19 shows, according to a second example of the fourth embodiment of the present invention, a pulse sequence for extracting only a $^1H$ signal $J_{HH}$-coupled within a spatially-localized three-dimensional excited region.
Figure 20:
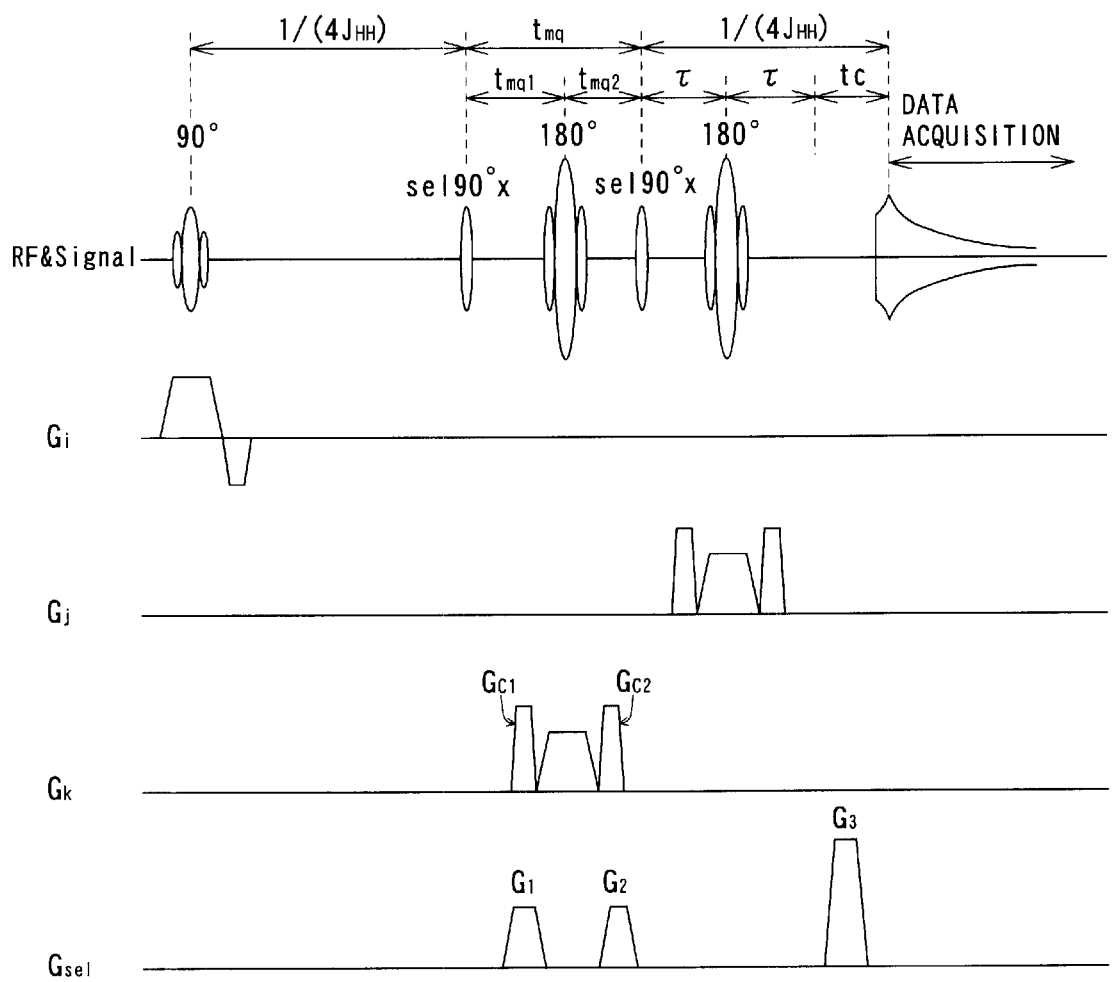
FIG. 20 shows, according to a third example of the fourth embodiment of the present invention, a pulse sequence for extracting only a $^1H$ signal $J_{HH}$-coupled within a spatially-localized three-dimensional excited region.

Referring to FIGS. 18 to 20, a fourth embodiment of the present embodiment will now be described. This embodiment relates to excitation of a spatial three-dimensional localized region.

Providing the 90° RF pulse, the first 180° RF pulse, and the second 180° RF pulse described in FIGS. 15 to 17 as slice-selective RF pulses makes it possible to perform spatial three-dimensional localized excitation. A pulse sequence to realize such excitation will now be shown in each of FIGS. 18 to 20.

FIRST EXAMPLE

A pulse sequence according to a first example is shown, in which a 90° RF pulse and a 180° RF pulse are applied in turn as slice-selective RF pulses by concurrently applying i- and j-axial slice gradient pulses therewith. This application causes $^1H$ spins present within a slab to be selectively excited, the slab being formed by crossed slices perpendicular to the i-axis and j-axis, respectively. The coupling $J_{HH}$ begins evolving responsively within the selected slab. A frequency-selective radiation pulse, which follows the 180° RF pulse, is applied toward the GABA-3, resulting in generation of the multiple-quantum coherences between the GABA-3 and GABA-4. A second 180° RF pulse with a slice gradient pulse is then applied to select a certain slice perpendicular to the k-axis. This creates a three-dimensionally localized region at a crossed location between the above slab and the slice perpendicular to the k-axis. The second 180° RF pulse causes the order of the double-quantum coherences between the GABA-3 and GABA-4 to change from "+2 to −2."

A further frequency-selective radiation pulse to the GABA-3, which is applied successively, generates the single-quantum coherence of the GABA-4, making its magnetic resonance signal observable. With coherence-selection grandaunt magnetic pulses applied in the pulse sequence in order to suppress signals from the water and Cr, desired coherence-transfer pathways can be selected as "−1, +1, +2, −2, to −1." This way allows a three-dimensional spatial region to be excited.

Before and after the 180° RF pulse applied during the period $t_{mq}$ for the multiple-quantum coherences, crusher pulses $G_{c1}$ and $G_{c2}$ are applied, respectively. When the crusher pulses $G_{c1}$ and $G_{c2}$ are determined so that their time-integral values become equal to each other, as shown in FIG. 18, G1t1=G2t2 and G3=0 are provided, thus satisfying the foregoing expression (4). Hence, provided that the coherence-selection gradient pulses are determined to meet the expression (4) independently of the crusher pulses, signals from the water and Cr can be suppressed and only the GABA-4 can be allowed to detect its signal.

SECOND AND THIRD EXAMPLES

Pulse sequences according to a second example and a third example are shown in FIGS. 19 and 20. In both the pulse sequences, a 90° RF pulse is first applied as a slice-selective RF pulse with an i-axis slice gradient pulse applied concurrently. This selectively excites a certain slice perpendicular to the i-axis, and the coupling $J_{HH}$ evolves within the selected slice. A consecutively applied frequency-selective radiation pulse to the GABA-3 generates multiple-quantum coherences between the GABA-3 and GABA-4. A succeeding 180° RF pulse with a slice gradient pulse creates a certain slice perpendicular to the j-axis. Thus, the double-quantum coherences of the GABA-3 and GABA-4 within the two-dimensionally localized slab formed at a crossed position of both the slices transfers in its order from "−2 to +2."

A succeeding second frequency-selective radiation pulse to the GABA-3 generates the signal-quantum coherence of the GABA-4, so that its magnetic resonance signal becomes observable. Further, coherence-selection gradient pulses for suppression of the water signal and Cr signal are applied during performing the pulse sequence, which leads to selection of desired coherence-transfer pathways, that is, "−1, −2, +2, +1, to −1." Therefore, the spatially three-dimensional localized excitement can be conducted.

Before and after the 180° RF pulse applied during the period $t_{mq}$ for the multiple-quantum coherences, crusher pulses $G_{c1}$ and $G_{c2}$ are applied, respectively. When the crusher pulses $G_{c1}$ and $G_{c2}$ are determined so that they are balanced to each other, as shown in FIGS. 19 and 20, G1t1=G2t2 and G3=0 are provided, thus satisfying the foregoing expression (8). Hence, provided that the coherence-selection gradient pulses are determined to meet the expression (8) independently of the crusher pulses, signals from the water and Cr can be suppressed and only the GABA-4 can be allowed to detect its signal.

(Fifth Embodiment)

Referring to a fifth embodiment of the present invention will now be described. This embodiment relates to use of the foregoing DANTE pulses.

Figure 21:
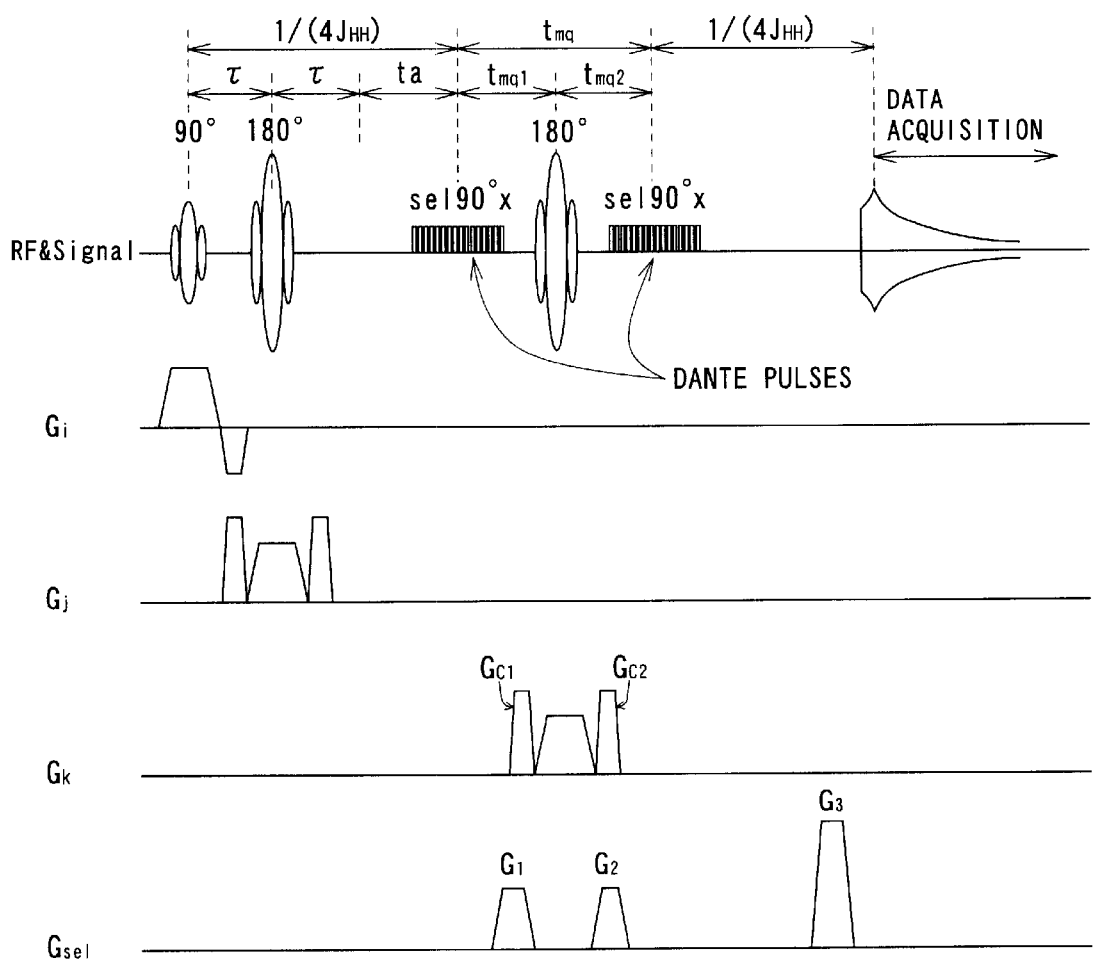
FIG. 21 is a pulse sequence that uses DANTE pulses serving as a selective radiation pulse, according to a fifth embodiment of the present invention.

In the pulse sequences described in the foregoing embodiments, the frequency-selective radiation pulses "sel 90° x", which are radio-frequency magnetic pulses directed to frequency-selective radiation, can be replaced by DANTE pulses. FIG. 21 exemplifies use of the DANTE pulses applied to the pulse sequence of FIG. 18.

As described so far, by using the magnetic resonance systems and the acquisition methods of magnetic resonance signals according to the foregoing various embodiments, spectra can be acquired in a stable manner, with suppressing unstable factors of the system, such as fluctuations in the strength of radio-frequency magnetic fields. In addition, such acquisition can be realized without adjustment of the phases of radio-frequency magnetic pulses to be applied. Further, acquired spectra are not visually complicated, which is able to avoid the necessity of using a complex spectrum analysis. Still further, magnetic resonance signals of $J_{HH}$-coupled $^1H$ can be obtained, which are reluctant to errors in flip angles and signal loss due to RF distributions.

The present invention is not confined to the configurations listed in the above embodiments, but without departing from the gist described in claims, it is further possible that the present invention is put into practice in other appropriate configuration.

What is claimed is:

1. A method of acquiring a magnetic resonance signal of a desired hydrogen nucleus $^1H$ existing within an object being examined and being placed in a static field, the method comprising the steps of:

applying to the object a first radio-frequency magnetic pulse of which frequency corresponds to a resonance freguency of the desired hydrogen nucleus $^1H$;

applying, after applying the first radio-frequency magnetic pulse, to the object a second radio-frequency magnetic pulse to frequency-selectively excite a specific hydrogen nucleus $^1H$ existing within the object and being coupled to the desired hydrogen nucleus $^1H$ through a homonuclear spin-spin coupling, thus producing a multiple-quantum coherence between the desired hydrogen nucleus $^1H$ and the specific hydrogen nucleus $^1H$;

applying, after applying the second radio-frequency magnetic pulse, to the object a third radio-frequency magnetic pulse of which frequency corresponds to the resonance frequency;

applying, after applying the third radio-frequency magnetic pulse, to the object a fourth radio-frequency magnetic pulse to frequency-selectively excite the specific hydrogen nucleus $^1H$, thus producing a single-quantum coherence of the desired hydrogen nucleus $^1H$; and acquiring, after applying the fourth radio-frequency magnetic pulse, the magnetic resonance signal of the desired hydrogen nucleus $^1H$;

wherein, in cases where a constant indicating the homonuclear spin-spin coupling is $J_{HH}$, the second radio-frequency magnetic pulse is applied at a time when a period of time corresponding to "(2m+1)/2n" times as large as an inverse number of the constant $J_{HH}$ elapses from the application of the first radio-frequency magnetic pulse, in which m=0, 1, 2, 3, . . . and n is the number of $^1H$ spins coupled to the desired hydrogen nucleus $^1H$.

2. The acquisition method of claim 1, wherein a first gradient pulse is applied during a period of time lasting from a time at which the application of the second radio-frequency magnetic pulse finishes to a further time at which the application of the third radio-frequency magnetic pulse starts, a second gradient pulse is applied during a period of time lasting from a time at which the application of the third radio-frequency magnetic pulse finishes to a further time at which the application of the fourth radio-frequency magnetic pulse, and a third gradient pulse is applied during a period of time lasting from a time at which the application of the fourth radio-frequency magnetic pulse finishes to a further time at which the acquisition of the magnetic resonance signal starts, wherein, when a time integral value of an intensity of the first gradient pulse is expressed by G1, a time integral value of an intensity of the second gradient pulse is expressed by G2, and a time integral value of an intensity of the third gradient pulse is expressed by G3, the time integral values G1, G2 and G3 are determined to meet a condition of $$2G1-2G2-G3=0.$$

3. The acquisition method of claim 1, wherein at least one of both the first and third radio-frequency magnetic pulses is set as a slice-selective pulse applied together with a slice gradient pulse.

4. The acquisition method of claim 1, wherein the desired hydrogen nucleus $^1H$ is a GABA (γ-aminobutyric acid)-4 and the specific hydrogen nucleus $^1H$ is a GABA-3.

5. A method of acquiring a magnetic resonance signal of a desired hydrogen nucleus $^1H$ existing within an object being examined and being placed in a static field, the method comprising the steps of:

applying to the object a first radio-frequency magnetic pulse and a second radio-frequency magnetic pulse in sequence, a frequency of each of the first and second radio-frequency magnetic pulses corresponding to a resonance frequency of the desired hydrogen nuclei $^1$H;

applying, after applying the first and second radio-frequency magnetic pulses, to the object a third radio-frequency magnetic pulse to excite frequency-selectively a specific hydrogen nucleus $^1$H coupled to the desired hydrogen nucleus $^1$H through a homonuclear spin-spin coupling, thus producing a multiple-quantum coherence between the desired hydrogen nucleus $^1$H and the specific hydrogen nucleus $^1$H;

applying, after applying the third radio-frequency magnetic pulse, to the object a fourth radio-frequency magnetic pulse of which frequency corresponds to the resonance frequency;

applying, after applying the fourth radio-frequency magnetic pulse, to the object a fifth radio-frequency magnetic pulse to frequency-selectively excite the specific hydrogen nucleus $^1$H, thus producing a single-quantum coherence of the desired hydrogen nucleus $^1$H; and acquiring, after applying the fifth radio-frequency magnetic pulse, the magnetic resonance signal of the desired hydrogen nucleus $^1$H.

6. The acquisition method of claim 5, wherein, in cases where a constant indicating the homonuclear spin-spin coupling is $J_{HH}$, the third radio-frequency magnetic pulse is applied at a time when a period of time corresponding to "(2m+1)/2n" times as large as an inverse number of the constant $J_{HH}$ elapses from the application of the first radio-frequency magnetic pulse, in which m=0, 1, 2, 3, . . . and n is the number of $^1$H spins coupled to the desired hydrogen nucleus $^1$H.

7. The acquisition method of claim 5, wherein a first gradient pulse is applied during a period of time lasting from a time at which the application of the third radio-frequency magnetic pulse finishes to a further time at which the application of the fourth radio-frequency magnetic pulse starts, a second gradient pulse is applied during a period of time lasting from a time at which the application of the fourth radio-frequency magnetic pulse finishes to a further time at which the application of the fifth radio-frequency magnetic pulse, and a third gradient pulse is applied during a period of time lasting from a time at which the application of the fifth radio-frequency magnetic pulse finishes to a further time at which the acquisition of the magnetic resonance signal starts, wherein, when a time integral value of an intensity of the first gradient pulse is expressed by G1, a time integral value of an intensity of the second gradient pulse is expressed by G2, and a time integral value of an intensity of the third gradient pulse is expressed by G3, the time integral values G1, G2 and G3 are determined to meet a condition of $$2G1-2G2-G3=0.$$

8. The acquisition method of claim 5, wherein, when a period of time from the application of the first radio-frequency magnetic pulse to the application of the second radio-frequency magnetic pulse is expressed by $\tau$, a period of time from the application of the third radio-frequency magnetic pulse to the application of the fourth radio-frequency magnetic pulse is expressed by $t_{mq1}$, and a period of time from the application of the fourth radio-frequency magnetic pulse to the application of the fifth radio-frequency magnetic pulse is expressed by $t_{mq2}$, the periods of time of $\tau$, $t_{mq1}$ and $t_{mq2}$ are determined to meet a condition of $$-2\tau=2t_{mq1}-2t_{mq2}=0.$$

9. The acquisition method of claim 5, wherein at least one of the first, second, and fourth radio-frequency magnetic pulses is set as a slice-selective pulse applied together with a slice gradient pulse.

10. The acquisition method of claim 5, wherein the desired hydrogen nucleus $^1$H is a GABA ($\gamma$-aminobutyric acid)-4and the specific hydrogen nucleus $^1$H is a GABA-3.

11. A method of acquiring a magnetic resonance signal of a desired hydrogen nucleus $^1$H existing within an object being examined and being placed in a static field, the method comprising the steps of:

applying to the object a first radio-frequency magnetic pulse of which freguency corresponds to a resonance frequency of the desired hydrogen nuclei $^1$H;

applying, after applying the first radio-frequency magnetic pulse, to the object a second radio-frequency magnetic pulse to frequency-selectively excite a specific hydrogen nucleus $^1$H coupled to the desired hydrogen nucleus $^1$H through the homonuclear spin-spin coupling, thus producing a multiple-quantum coherence between the desired hydrogen nucleus $^1$HH and the specific hydrogen nucleus $^1$H;

applying, after applying the second radio-frequency magnetic pulse, to the object a third radio-frequency magnetic pulse of which frequency corresponds to the resonance frequency;

applying, after applying the third radio-frequency magnetic pulse, to the object a fourth radio-frequency magnetic pulse to frequency-selectively excite the specific hydrogen nucleus $^1$H;

applying, after applying the fourth radio-frequency magnetic pulse, to the object a fifth radio-frequency magnetic pulse, thus producing a single-quantum coherence of the desired hydrogen $^1$H; and acquiring, after applying the fifth radio-frequency magnetic pulse, the magnetic resonance signal of the desired hydrogen necleus $^1$H;

wherein, in cases where a constant indicating the homonuclear spin-spin coupling is $J_{HH}$, the second radio-frequency magnetic pulse is applied at a time when a period of time corresponding to "(2m+1)/2n" times as large as an inverse number of the constant $J_{HH}$ elapses from the application of the first radio-frequency magnetic pulse, in which m=0, 1, 2, 3, . . . and n is the number of $^1$H spins coupled to the desired hydrogen nucleus $^1$H.

12. The acquisition method of claim 11, wherein a first gradient pulse is applied during a period of time lasting from a time at which the application of the second radio-frequency magnetic pulse finishes to a further time at which the application of the third radio-frequency magnetic pulse starts, a second gradient pulse is applied during a period of time lasting from a time at which the application of the third radio-frequency magnetic pulse finishes to a further time at which the application of the fourth radio-frequency magnetic pulse, and a third gradient pulse is applied during a period of time lasting from a time at which the application of the fifth radio-frequency magnetic pulse finishes to a further time at which the acquisition of the magnetic resonance signal starts, wherein, when a time integral value of an intensity of the first gradient pulse is expressed by G1, a time integral value of an intensity of the second gradient pulse is expressed by G2, and a time integral value of an intensity of the third gradient pulse is expressed by G3, the time integral values G1, G2 and G3 are determined to meet a condition of $$-2G1+2G2-G3 =0.$$

13. The acquisition method of claim 11, wherein, when a period of time from the application of the first radio-frequency magnetic pulse to the application of the second radio-frequency magnetic pulse is expressed by $t_{prep}$, a period of time from the application of the second radio-frequency magnetic pulse to the application of the third radio-frequency magnetic pulse is expressed by $t_{mq1}$, and a period of time from the application of the third radio-frequency magnetic pulse to the application of the fourth radio-frequency magnetic pulse is expressed by $t_{mq2}$, and when a period of time from the fourth radio-frequency magnetic pulse to the fifth radio-frequency magnetic pulse is equal to or longer than a period of time from an applied time of the fifth radio-frequency magnetic pulse to a time at which the period of time of $t_{prep}$ elapses from the application of the fourth radio-frequency magnetic pulse, the periods of time of τ, $t_{mq1}$ and $t_{mq2}$ are determined to meet a condition of $$-2t_{mq1}+2t_{mq2}-2τ=0.$$

14. The acquisition method of claim 11, wherein, when a period of time from the application of the first radio-frequency magnetic pulse to the application of the second radio-frequency magnetic pulse is expressed by $t_{prep}$, a period of time from the application of the second radio-frequency magnetic pulse to the application of the third radio-frequency magnetic pulse is expressed by $t_{mq1}$, and a period of time from the application of the third radio-frequency magnetic pulse to the application of the fourth radio-frequency magnetic pulse is expressed by $t_{mq2}$, and when a period of time from the fourth radio-frequency magnetic pulse to the fifth radio-frequency magnetic pulse is shorter than a period of time from an applied time of the fifth radio-frequency magnetic pulse to a time at which the period of time of $t_{prep}$ elapses from the application of the radio-frequency magnetic pulse, the periods of time of τ, $t_{mq1}$ and $t_{mq2}$ are determined to meet a condition of $$-2t_{mq1}+2t_{mq2}+2τ-2t_{prep} =0.$$

15. The acquisition method of claim 11, wherein at least one of the first, third and fifth radio-frequency magnetic pulses is set as a slice-selective pulse applied together with a slice gradient pulse.

16. The acquisition method of claim 11, wherein the desired hydrogen nucleus $^1H$ is a GABA (γ-aminobutyric acid)-4 and the specific hydrogen nucleus $^1H$ is a GABA-3.

17. A magnetic resonance system for acquiring a magnetic resonance signal of a desired hydrogen nucleus $^1H$ existing within an object being examined and being placed in a static field comprising:

first means for applying to the object a first radio-frequency magnetic pulse of which frequency corresponds to a resonance frequency of the desired hydrogen nucleus $^1H$;

second means for applying, after the first means applied the first radio-frequency magnetic pulse, to the object a second radio-frequency magnetic pulse to frequency-selectively excite a specific hydrogen nucleus $^1H$ existing within the object and being coupled to the desired bydrogen nucleus $^1H$ through a homonuclear spin-spin coupling, thus producing a multiple-quantum coherence between the desired hydrogen nucleus $^1H$ and the specific hydrogen nucleus $^1H$;

third means for applying, after the third means applied the second radio-frequency magnetic pulse, to the object a third radio-frequency magnetic pulse of which frequency corresponds to the resonance frequency;

fourth means for applying, after the third means applied the third radio-frequency magnetic pulse, to the object a fourth radio-frequency magnetic pulse to frequency-selectively excite the specific hydrogen nucleus $^1H$, thus producing a single-quantum coherence of the desired hydrogen nucleus $^1H$; and fifth means for acquiring, after the fourth means applied the fourth radio-frequency magnetic pulse, the magnetic resonance signal of the desired hydrogen $^1H$;

wherein, in cases where a constant indicating the homonuclear spin-spin coupling is $J_{HH}$, the second radio-frequency magnetic pulse is applied at a time when a period of time corresponding to "(2m+1)/2n" times as large as an inverse number of the constant $J_{HH}$ elapses from the application of the first radio-frequency magnetic pulse, in which m=0, 1, 2, 3, . . . and n is the number of $^1H$ spins coupled to the desired hydrogen nucleus $^1H$.

18. A magnetic resonance system for acquiring a magnetic resonance signal of a desired hydrogen $^1H$ existing within an object being examined and being placed in a static field comprising:

first means for applying to the object a first radio-frequency magnetic pulse of which frequency corresponds to a resonance frequency of the desired hydrogen nuclei $^1H$;

second means for applying, after the first means applied the first radio-frequency magnetic pulse, to the object a second radio-frequency magnetic pulse of which frequency corresponds to the resonance frequency;

third means for applying, after the second means applied the second radio-frequency magnetic pulse, to the object a third radio-frequency magnetic pulse to excite frequency-selectively a specific hydrogen nucleus $^1H$ coupled to the desired hydrogen nucleus $^1H$ through a homonuclear spin-spin coupling, thus producing a multiple-quantum coherence between the desired hydrogen nucleus $^1H$ and the specific hydrogen nucleus $^1H$;

fourth means for applying, after the third means applied the third radio-frequency magnetic pulse, to the object a fourth radio-frequency magnetic pulse of which frequency corresponds to the resonance frequency;

fifth means for applying, after the fourth means applied the fourth radio-frequency magnetic pulse, to the object a fifth radio-frequency magnetic pulse to frequency-selectively excite the specific hydrogen nucleus $^1H$, thus producing a single-quantum coherence of the desired hydrogen nucleus $^1H$; and six means for acquiring, after the fifth means applied the fifth radio-frequency magnetic pulse, the magnetic resonance signal of the desired hydrogen nucleus $^1H$.

19. A magnetic resonance system for acquiring a magnetic resonance signal of a desired hydrogen nucleus $^1H$ existing within an object being examined and being placed in a static field comprising:

first means for applying to the object a first radio-frequency magnetic pulse of which frequency corresponds to a resonance frequency of the desired hydrogen nuclei $^1$H;

second means for applying, after the first means applied the first radio-frequency magnetic pulse, to the object a second radio-frequency magnetic pulse to frequency-selectively excite a specific hydrogen nucleus $^1$H coupled to the desired hydrogen nucleus $^1$H through the homonuclear spin-spin coupling, thus producing a multiple-quantum coherence between the desired hydrogen nucleus $^1$H and the specific hydrogen nucleus $^1$H;

third means for applying, after the second means applied the second radio-frequency magnetic pulse, to the object a third radio-frequency magnetic pulse of which frequency corresponds to the resonance frequency;

fourth means for applying, after the third means applied the third radio-frequency magnetic pulse, to the object a fourth radio-frequency magnetic pulse to frequency-selectively excite the specific hydrogen nucleus $^1$H;

fifth means for applying, after the fourth means applied the fourth radio-frequency magnetic pulse, to the object a fifth radio-frequency magnetic pulse, thus producing a single-quantum coherence of the desired hydrogen $^1$H; and sixth means for acquiring, after the fifth means applied the fifth radio-frequency magnetic pulse, the magnetic resonance signal of the desired hydrogen nucleus $^1$H;

wherein, in cases where a constant indicating the homonuclear spin-spin coupling is $J_{HH}$, the second radio-frequency magnetic pulse is applied at a time when a period of time corresponding to "(2m+1)/2n" times as large as an inverse number of the constant $J_{HH}$ elapses from the application of the first radio-frequency magnetic pulse, in which m=0, 1, 2, 3, . . . and n is the number of $^1$H spins coupled to the desired hydrogen nucleus $^1$H.

20. A method of acquiring a magnetic resonance signal, with which a radio frequency magnetic pulse based on a resonance frequency of hydrogen nuclei $^1$H and a gradient pulse are applied to an object placed in a static field in a predetermined sequence of procedures, thereby the magnetic resonance signal of a nucleus $^1$H involving a homonuclear spin-spin coupling exerted between nuclei $^1$H being acquired, the method comprising:

applying to the object a first radio-frequency magnetic pulse to excite the nuclei $^1$H of a plurality of compounds;

applying, after applying the first radio-frequency magnetic pulse, to the object a first frequency-selective radiation pulse to excite a specific nucleus $^1$H coupled to a desired nucleus $^1$H among the nuclei $^1$H of the plurality of compounds through the homonuclear spin-spin coupling;

applying, after applying the first frequency-selective radiation pulse, to the object a second radio-frequency magnetic pulse;

applying, after applying the second radio-frequency magnetic pulse, to the object a second frequency-selective radiation pulse to excite the specific nucleus $^1$H; and acquiring, after applying the second frequency-selective radiation pulse, the magnetic resonance signal of the desired nucleus $^1$H;

wherein the hydrogen nuclei $^1$H included in γ-aminobutyric acid (GABA) present within the object and the desired nucleus $^1$H composes a GABA-4 coupled to a GABA-3 through the homonuclear spin-spin coupling.

21. A method of acquiring a magnetic resonance signal, with which a radio frequency magnetic pulse based on a resonance frequency of hydrogen nuclei $^1$H and a gradient pulse are applied to an object placed in a static field in a predetermined sequence of procedures, thereby the magnetic resonance signal of a nucleus $^1$H involving a homonuclear spin-spin coupling exerted between nuclei $^1$H being acquired, the method comprising:

applying to the object a first radio-frequency magnetic pulse and a second radio-frequency magnetic pulse in sequence;

applying, after applying the first and second radio-frequency magnetic pulses, to the object a first frequency-selective radiation pulse to excite a specific nucleus $^1$H coupled to a desired nucleus $^1$H through the homonuclear spin-spin coupling;

applying, after applying the first frequency-selective radiation pulse, to the object a third radio-frequency magnetic pulse;

applying, after applying the third radio-frequency magnetic pulse, to the object a second frequency-selective radiation pulse to excite the specific nucleus $^1$H; and acquiring, after applying the second frequency-selective radiation pulse, the magnetic resonance signal of the desired nucleus $^1$H;

wherein the hydrogen nuclei $^1$H included in γ-aminobutyric acid (GABA) present within the object and the desired nucleus $^1$H composes a GABA-4 coupled to a GABA-3 through the homonuclear spin-spin coupling.

22. A method of acquiring a magnetic resonance signal, with which a radio frequency magnetic pulse based on a resonance frequency of hydrogen nuclei $^1$H and a gradient pulse are applied to an object placed in a static field in a predetermined sequence of procedures, thereby the magnetic resonance signal of a nucleus $^1$H involving a homonuclear spin-spin coupling exerted between nuclei $^1$H being acquired, the method comprising:

applying to the object a first radio-frequency magnetic pulse;

applying, after applying the first radio-frequency magnetic pulse, to the object a first frequency-selective radiation pulse to excite a specific nucleus $^1$H coupled to a desired nucleus $^1$H through the homonuclear spin-spin coupling;

applying, after applying the first frequency-selective radiation pulse, to the object a second radio-frequency magnetic pulse;

applying, after applying the second radio-frequency magnetic pulse, to the object a second frequency-selective radiation pulse to excite the specific nucleus $^1$H;

applying, after applying the second frequency-selective radiation pulse, to the object a third radio-frequency magnetic pulse; and acquiring, after applying the third frequency-selective radiation pulse, the magnetic resonance signal of the desired nucleus $^1$H;

wherein the hydrogen nuclei $^1$H included in γ-aminobutyric acid (GABA) present within the object and the desired nucleus $^1$H composes a GABA-4 coupled to a GABA-3 through the coupling.

* * * * *